United States Patent
Kim et al.

(10) Patent No.: US 11,837,321 B2
(45) Date of Patent: Dec. 5, 2023

(54) APPARATUS, MEMORY CONTROLLER, MEMORY DEVICE, MEMORY SYSTEM, AND METHOD FOR CLOCK SWITCHING AND LOW POWER CONSUMPTION

(71) Applicant: SAMSUNG ELECTRONICS CO., LTD., Suwon-si (KR)

(72) Inventors: Hyungjin Kim, Seoul (KR); Jungsik Park, Suwon-si (KR); Soongmann Shin, Hwaseong-si (KR)

(73) Assignee: Samsung Electronics Co., Ltd.

( * ) Notice: Subject to any disclaimer, the term of this patent is extended or adjusted under 35 U.S.C. 154(b) by 25 days.

(21) Appl. No.: 17/372,672

(22) Filed: Jul. 12, 2021

(65) Prior Publication Data
US 2022/0199131 A1    Jun. 23, 2022

(30) Foreign Application Priority Data
Dec. 17, 2020    (KR) .................. 10-2020-0177717

(51) Int. Cl.
   *G11C 7/22*    (2006.01)
   *G11C 7/10*    (2006.01)
   *G11C 8/18*    (2006.01)

(52) U.S. Cl.
   CPC .............. *G11C 7/222* (2013.01); *G11C 7/109* (2013.01); *G11C 7/1045* (2013.01); *G11C 7/1063* (2013.01); *G11C 8/18* (2013.01)

(58) Field of Classification Search
   CPC ................................. G11C 7/22; G11C 7/222
   USPC ...................................................... 365/233.1
   See application file for complete search history.

(56) References Cited

U.S. PATENT DOCUMENTS

| | | | |
|---|---|---|---|
| 6,381,180 B1 * | 4/2002 | Merritt ................ | G11C 7/1078 |
| | | | 711/E12.083 |
| 6,516,362 B1 * | 2/2003 | Magro .................... | G06F 5/06 |
| | | | 713/400 |
| 7,395,398 B2 | 7/2008 | Kim | |
| 7,467,277 B2 | 12/2008 | Barnum et al. | |
| 10,169,262 B2 | 1/2019 | West et al. | |
| 10,515,670 B1 | 12/2019 | Lee et al. | |

(Continued)

FOREIGN PATENT DOCUMENTS

| | | |
|---|---|---|
| KR | 100396885 | 9/2003 |
| KR | 100546362 | 1/2006 |
| KR | 1020190029657 | 3/2019 |

OTHER PUBLICATIONS

Toggle DDR 4.0, Samsung /Toshiba ,Rev.1.0,Mar. 2018.*

*Primary Examiner* — Muna A Techane
(74) *Attorney, Agent, or Firm* — Fish & Richardson P.C.

(57) ABSTRACT

In an apparatus, a memory controller, a memory device, and a method for switching frequencies of clock signals to reduce power consumption, when the memory device performs an internal operation according to a command of the memory controller, a frequency of a clock signal of the memory controller is changed. The memory controller switches the frequency of the clock signal to a low frequency according to assertion of a status signal that indicates a busy operation status of the memory device according to the command, and switches the frequency of the clock signal to a high frequency according to de-assertion of the status signal that indicates a ready operation status of the memory device.

9 Claims, 21 Drawing Sheets

(56) References Cited

U.S. PATENT DOCUMENTS

| | | | |
|---|---|---|---|
| 2009/0040843 A1* | 2/2009 | Sprouse | G11C 16/225 |
| | | | 365/189.16 |
| 2009/0125739 A1* | 5/2009 | Satoh | G06F 1/3284 |
| | | | 713/324 |
| 2012/0223749 A1* | 9/2012 | Sasaki | H03K 5/135 |
| | | | 327/141 |
| 2018/0024610 A1 | 1/2018 | Orakwue | |

* cited by examiner

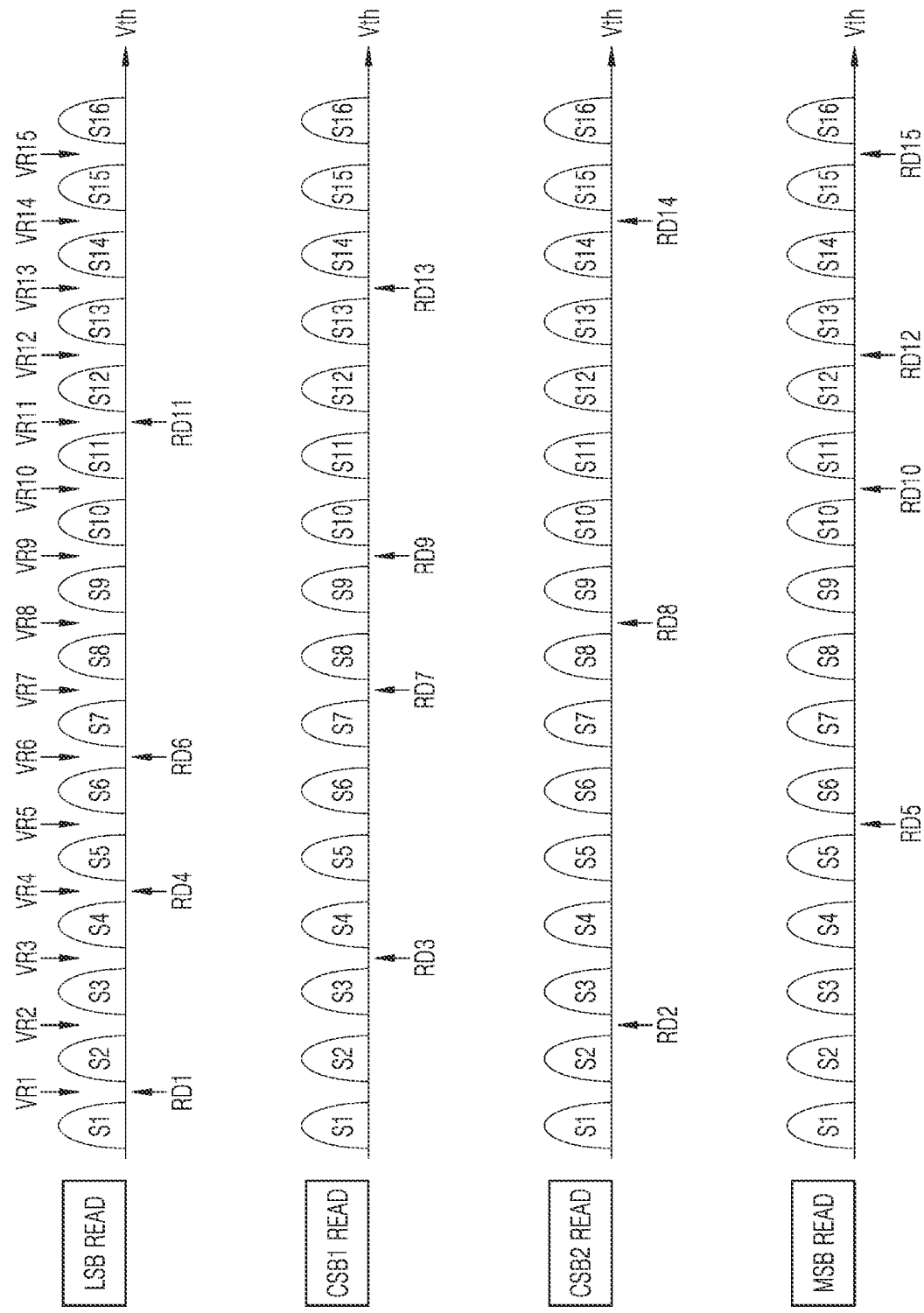

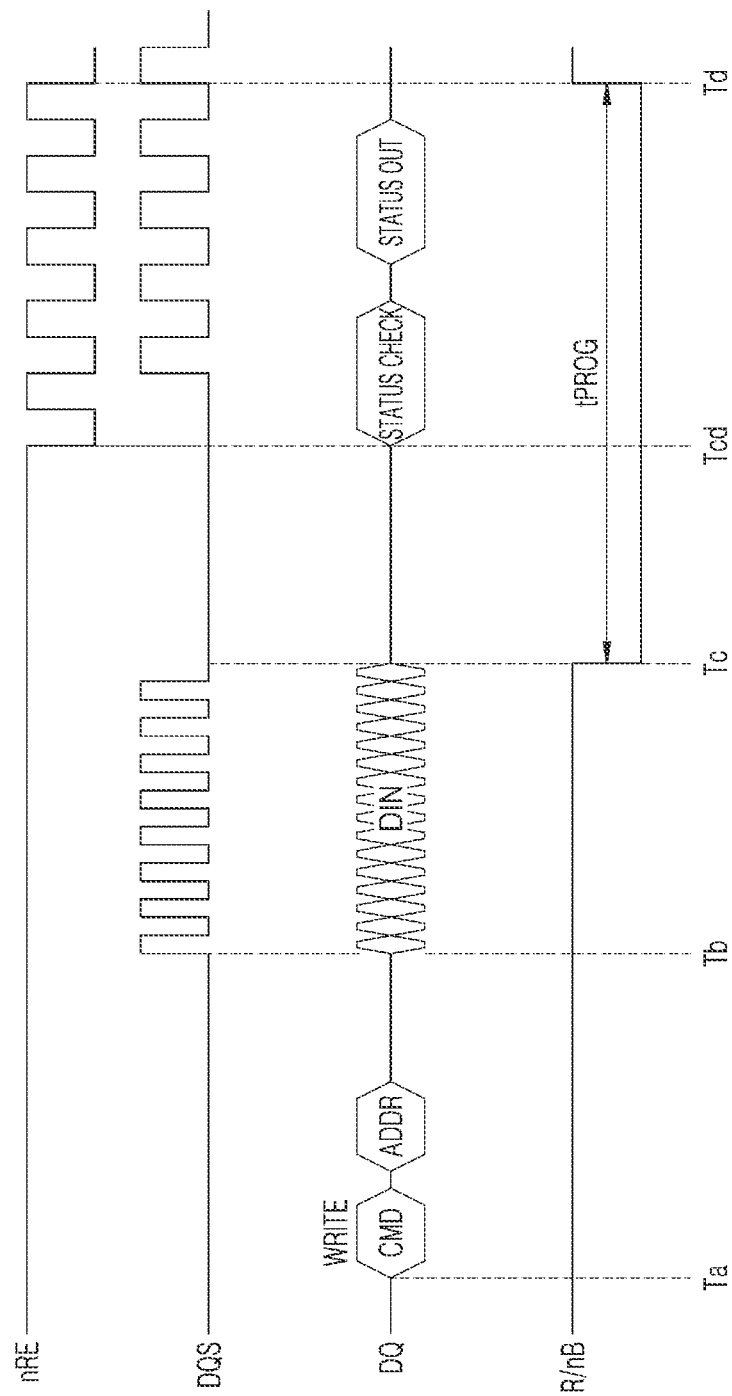

APPARATUS, MEMORY CONTROLLER, MEMORY DEVICE, MEMORY SYSTEM, AND METHOD FOR CLOCK SWITCHING AND LOW POWER CONSUMPTION

CROSS-REFERENCE TO RELATED APPLICATION

A claim of priority under 35 U.S.C. § 119 is made to Korean Patent Application No. 10-2020-0177717, filed on Dec. 17, 2020, in the Korean Intellectual Property Office, the entirety of which is hereby incorporated by reference.

BACKGROUND

The present disclosure relates to apparatuses and methods, and more particularly to an apparatus, a memory controller, a memory device, and a memory system, and a method for switching frequencies of clock signals associated with an operation of the memory device, to reduce power consumption.

Electronic systems using semiconductor chips may include dynamic random access memory (DRAM) as an operation memory device or a main memory device to store data or instructions used by a host and/or to perform computational operations, and may include a storage device used as a storage medium. The storage device may include nonvolatile memory devices. As the capacity of storage devices has recently increased, there has been increasing demand for nonvolatile memory devices that have high capacity, and that perform stable and fast real-time processing of large amounts of data. In mobile systems, low-power operation of storage devices is an important consideration and is required to conserve power and increase battery lifetime.

SUMMARY

Embodiments of the inventive concepts provide an apparatus including a plurality of signal pins respectively connected to an external device through a plurality of signal lines; and a clock control circuit that instructs the external device through some of the plurality of signal pins to perform one operation having a first operation mode and a second operation mode, and generates a clock signal relating to the first operation mode and the second operation mode for the one operation of the external device. The clock control circuit switches a frequency of the clock signal to a first frequency during the first operation mode of the one operation, and switches the frequency of the clock signal to a second frequency different from the first frequency during the second operation mode according to de-assertion of a status signal provided to the apparatus from the external device.

Embodiments of the inventive concepts further provide a memory controller that controls a memory device, the memory controller including a plurality of signal pins connected to signal lines that respectively carry signals; and a clock control circuit that receives a status signal that indicates an operation status of the memory device through a signal pin from among the plurality of signal pins, and generates a clock signal based on the status signal. The clock control circuit generates the clock signal set to a relatively low frequency based on the status signal indicating that the memory device is in a busy status, and generates the clock signal set to a relatively high frequency based on the status signal indicating that the memory device is in a ready status.

Embodiments of the inventive concepts still further provide a memory device including a plurality of signal pins connected to signal lines that respectively carry signals; and a control logic circuit that controls a first operation relating to a first command in response to the first command received through first signal pins from among the plurality of signal pins. During the first operation, the memory device transmits a status signal indicating an operation status of the memory device through a second signal pin from among the plurality of signal pins, and transmits and receives a clock signal that is toggled at a changed frequency relating to the status signal through a third signal pin from among the plurality of signal pins.

Embodiments of the inventive concepts also provide a memory system including a memory device including a plurality of memory cells; and a memory controller that transmits a command and a clock signal to the memory device to control the memory device. The memory controller switches a frequency of the clock signal to a first frequency according to assertion of a status signal provided from the memory device that indicates an operation status of the memory device according to the command, and switches the frequency of the clock signal to a second frequency different from the first frequency according to de-assertion of the status signal.

Embodiments of the inventive concepts further provide a method of providing a clock signal including determining, by a memory controller, a first command for an operation condition of a memory device; performing, by the memory device, a first operation in response to the first command; asserting, by the memory device, a status signal indicating a status of the first operation; switching, by the memory controller, a frequency of the clock signal to a first frequency in response to the assertion of the status signal; de-asserting, by the memory device, the status signal; and switching, by the memory controller, the frequency of the clock signal to a second frequency different from the first frequency according to the de-assertion of the status signal.

BRIEF DESCRIPTION OF THE DRAWINGS

Embodiments of the inventive concepts will be more clearly understood from the following detailed description taken in conjunction with the accompanying drawings in which:

FIG. 6B illustrates a chart descriptive of a page read operation in a storage device according to embodiments of the inventive concepts;

FIGS. 9A and 9B illustrate timing diagrams of a program operation of a storage device according to embodiments of the inventive concepts;

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
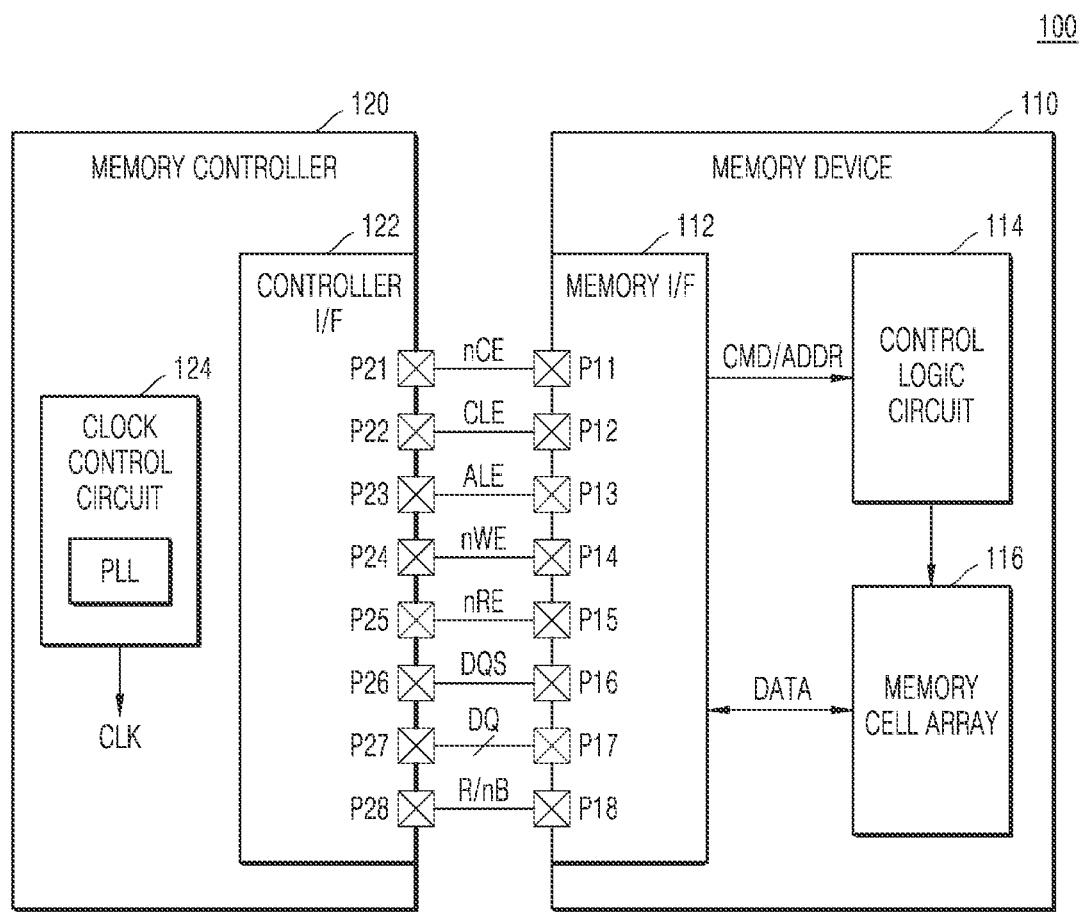
FIG. 1 illustrates a block diagram of a storage device according to embodiments of the inventive concepts.

FIG. 1 illustrates a block diagram of a storage device according to embodiments of the inventive concepts.

Referring to FIG. 1, a storage device 100 may include a memory device 110 and a memory controller 120. Although conceptual hardware configurations included in the storage device 100 are hereinafter described, other embodiments may include other configurations. The memory controller 120 may control the memory device 100 so that data is written to the memory device 110 in response to a write request from a host (not shown), or may control the memory device 110 so that data stored in the memory device 110 is read therefrom in response to a read request from the host.

In some embodiments, the storage device 100 may include internal memory embedded in an electronic device. For example, the storage device 100 may include an embedded universal flash storage (UFS) memory device, an embedded multi-media card (eMMC®), or solid state drive (SSD). However, the inventive concepts are not limited thereto, and in other embodiments the storage device 100 may for example include nonvolatile memory such as one time programmable read-only memory (OTPROM), programmable read-only memory (PROM), erasable and programmable read-only memory (EPROM)), electrically erasable and programmable read-only memory (EEPROM), mask read-only memory (ROM), or flash ROM, or the like. In some embodiments, the storage device 100 may include external memory attachable to and detachable from an electronic device. For example, the storage device 100 may include at least one of a UFS memory card, a Compact Flash® (CF) card, a Security Digital™ card (SD), microSD® card, a MiniSD® card, extreme digital (xD), and a Memory Stick™ (MS).

The memory device 110 may include first to eighth pins P11 to P18, a memory interface (IF) circuit 112, a control logic circuit 114, and a memory cell array 116.

The memory interface circuit 112 may receive a chip enable signal nCE from the memory controller 120 through the first pin P11. The memory interface circuit 112 may transmit and receive signals to and from the memory controller 120 through the second to eighth pins P12 to P18 according to the chip enable signal nCE. For example, when the chip enable signal nCE is in an enable status (for example, a low level), the memory interface circuit 112 may transmit and receive signals to and from the memory controller 120 through the second to eighth pins P12 to P18.

The memory interface circuit 112 may receive a command latch enable signal CLE, an address latch enable signal ALE, and a write enable signal nWE from the memory controller 120 through the second to fourth pins P12 to P14. The memory interface circuit 112 may receive a data signal DQ from the memory controller 120 through the seventh pin P17 or may transmit the data signal DQ to the memory controller 120 through the seventh pin P17. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signals.

The memory interface circuit 112 may acquire the command CMD from the data signal DQ received during an enable period (for example, a high level status) of the command latch enable signal CLE based on toggle timings of the write enable signal nWE. The memory interface circuit 112 may acquire the address ADDR from the data signal DQ received in an enable period (for example, a high level status) of the address latch enable signal ALE based on the toggle timings of the write enable signal nWE.

In an example embodiment, the write enable signal nWE may be toggled between a high level and a low level while maintaining a static status (for example, a high level or a low level). For example, the write enable signal nWE may be toggled in a period in which the command CMD or the address ADDR is transmitted. Accordingly, the memory interface circuit 112 may acquire the command CMD or the address ADDR based on the toggle timings of the write enable signal nWE.

The memory interface circuit 112 may receive the read enable signal nRE from the memory controller 120 through the fifth pin P15. The memory interface circuit 112 may receive the data strobe signal DQS from the memory controller 120 through the sixth pin P16 or may transmit the data strobe signal DQS to the memory controller 120.

During an operation of the memory device 110 that outputs the data DATA, the memory interface circuit 112 may receive the read enable signal nRE that is toggled through the fifth pin P15 before outputting the data DATA. The memory interface circuit 112 may generate the data strobe signal DQS that is toggled based on toggling of the read enable signal nRE. For example, the memory interface circuit 112 may generate the data strobe signal DQS that starts toggling after a previously determined delay (for example, tDQSRE) based on a toggling start time of the read enable signal nRE. The memory interface circuit 112 may transmit the data signal DQ including the data DATA based on a toggle timing of the data strobe signal DQS. Accordingly, the data DATA may be aligned with the toggle timing of the data strobe signal DQS and transmitted to the memory controller 120.

During an operation of the memory device 110 that inputs the data DATA, when the data signal DQ including the data DATA is received from the memory controller 120, the memory interface circuit 112 may receive the data strobe signal DQS that is toggled together with the data DATA. The memory interface circuit 112 may acquire the data DATA from the data signal DQ based on the toggle timing of the data strobe signal DQS. For example, the memory interface circuit 112 may acquire the data DATA by sampling the data signal DQ at rising and falling edges of the data strobe signal DQS.

The memory interface circuit 112 may transmit a ready-busy output signal R/nB to the memory controller 120 through the eighth pin P18. The memory interface circuit 112 may transmit status information of the memory device 110 to the memory controller 120 through the ready-busy output signal R/nB. When the memory device 110 is in a busy status (that is, when an internal operation of the memory device 110 is performed), the memory interface circuit 112 may transmit the ready-busy output signal R/nB indicating the busy status to the memory controller 120. When the memory device 110 is in a ready status (that is, when the internal operation of the memory device 110 is not performed or is completed), the memory interface circuit 112 may transmit the ready-busy output signal R/nB indicating the ready status to the memory controller 120. For example, while the memory device 110 reads the data DATA from the memory cell array 116 in response to a page read command, the memory interface circuit 112 may transmit the ready-busy output signal R/nB indicating the busy status (for example, a low level) to the memory controller 120. For example, while the memory device 110 programs the data DATA into the memory cell array 116 in response to a program command, the memory interface circuit 112 may transmit the ready-busy output signal R/nB indicating the busy status to the memory controller 120.

The control logic circuit 114 may generally control various operations of the memory device 110. The control logic circuit 114 may receive the command/address CMD/ADDR acquired from the memory interface circuit 112. The control logic circuit 114 may generate control signals for controlling other components of the memory device 110 according to the received command/address CMD/ADDR. For example, the control logic circuit 114 may generate various control signals for programming the data DATA into the memory cell array 116 or reading the data DATA from the memory cell array 116.

The memory cell array 116 may store the data DATA acquired from the memory interface circuit 112 under the control of the control logic circuit 114. The memory cell array 116 may output the stored data DATA to the memory interface circuit 112 under the control of the control logic circuit 114.

The memory cell array 116 may include a plurality of memory cells. For example, the plurality of memory cells may include flash memory cells. However, the inventive concepts are not limited thereto, and in some embodiments the memory cells may include for example resistive random access memory (RRAM) cells, ferroelectric random access memory (FRAM) cells, phase change random access memory (PRAM) cells, thyristor random access memory (TRAM) cells, or magnetic random access memory (MRAM) cells. In some embodiments, the memory cells may include static random access memory (SRAM) cells or dynamic random access memory (DRAM) cells. Hereinafter, embodiments of the inventive concepts will be described in which the memory cells are NAND flash memory cells.

The memory controller 120 may include first to eighth pins P21 to P28, a controller interface (IF) circuit 122, and a clock control circuit 124. The first to eighth pins P21 to P28 may correspond to the first to eighth pins P11 to P18 of the memory device 110.

The controller interface circuit 122 may transmit the chip enable signal nCE to the memory device 110 through the first pin P21. The controller interface circuit 122 may transmit and receive signals to and from the memory device 110 selected by the chip enable signal nCE through the second to eighth pins P22 to P28.

The controller interface circuit 122 may transmit the command latch enable signal CLE, the address latch enable signal ALE, and the write enable signal nWE to the memory device 110 through the second to fourth pins P22 to P24. The controller interface circuit 122 may transmit the data signal DQ to the memory device 110 through the seventh pin P27 or may receive the data signal DQ from the memory device 110.

The controller interface circuit 122 may transmit the data signal DQ including the command CMD or the address ADDR to the memory device 110 together with the write enable signal nWE that is toggled. The controller interface circuit 122 may transmit the data signal DQ including the command CMD to the memory device 110 as the command latch enable signal CLE having an enable status is transmitted and may transmit the data signal DQ including the address ADDR to the memory device 110 as the address latch enable signal ALE having an enable status is transmitted.

The controller interface circuit 122 may transmit the read enable signal nRE to the memory device 110 through the fifth pin P25. The controller interface circuit 122 may receive the data strobe signal DQS from the memory device 110 through the sixth pin P26 or may transmit the data strobe signal DQS to the memory device 110.

During an operation of the memory device 110 that outputs the data DATA, the controller interface circuit 122 may generate the read enable signal nRE that is toggled and may transmit the read enable signal nRE to the memory device 110. For example, the controller interface circuit 122 may generate the read enable signal nRE that changes from a fixed status (for example, a high level or a low level) to a toggled status before the data DATA is outputted. Accordingly, the memory device 110 may generate the data strobe signal DQS that is toggled based on the read enable signal nRE. The controller interface circuit 122 may receive the data signal DQ including the data DATA together with the data strobe signal DQS that is toggled from the memory device 110. The controller interface circuit 122 may acquire the data DATA from the data signal DQ based on a toggle timing of the data strobe signal DQS.

During an operation for the memory device 110 to receive the data DATA, the controller interface circuit 122 may generate the data strobe signal DQS that is toggled. For example, the controller interface circuit 122 may generate the data strobe signal DQS that changes from a fixed status (for example, a high level or a low level) to a toggled status before transmitting the data DATA. The controller interface circuit 122 may transmit the data signal DQ including the data DATA to the memory device 110 based on toggle timings of the data strobe signal DQS.

The controller interface circuit 122 may receive the ready-busy output signal R/nB from the memory device 110 through the eighth pin P28. The controller interface circuit 122 may determine status information of the memory device 110 based on the ready-busy output signal R/nB.

The clock control circuit 124 includes a phase-locked loop (hereinafter, referred to as "PLL") that generates a clock signal CLK to adjust a timing of the memory controller 120, a crystal oscillator, and/or other clock logic circuits. The PLL may be referred to as a component for generating the clock signal CLK. The clock control circuit 124 may control toggling signals (for example, the write enable signal nWE, the read enable signal nRE, and the data strobe signal DQS) provided to the memory device 110 based on the clock signal CLK.

The clock control circuit 124 may receive the ready-busy output signal R/nB through a signal pin indicating an operation status of the memory device 110 and may switch a frequency of the clock signal CLK to a low frequency according to assertion (busy status) of the ready-busy output signal R/nB and may switch the frequency of the clock signal CLK to a high frequency according to de-assertion (ready status) of the ready-busy output signal R/nB. The clock control circuit 124 may provide toggling signals (for example, the write enable signal nWE, the read enable signal nRE, and the data strobe signal DQS) that are toggled to the same clock frequency as the clock signal CLK having changed frequency. In some embodiments, the storage device may be characterized as a memory system.

Figure 2:
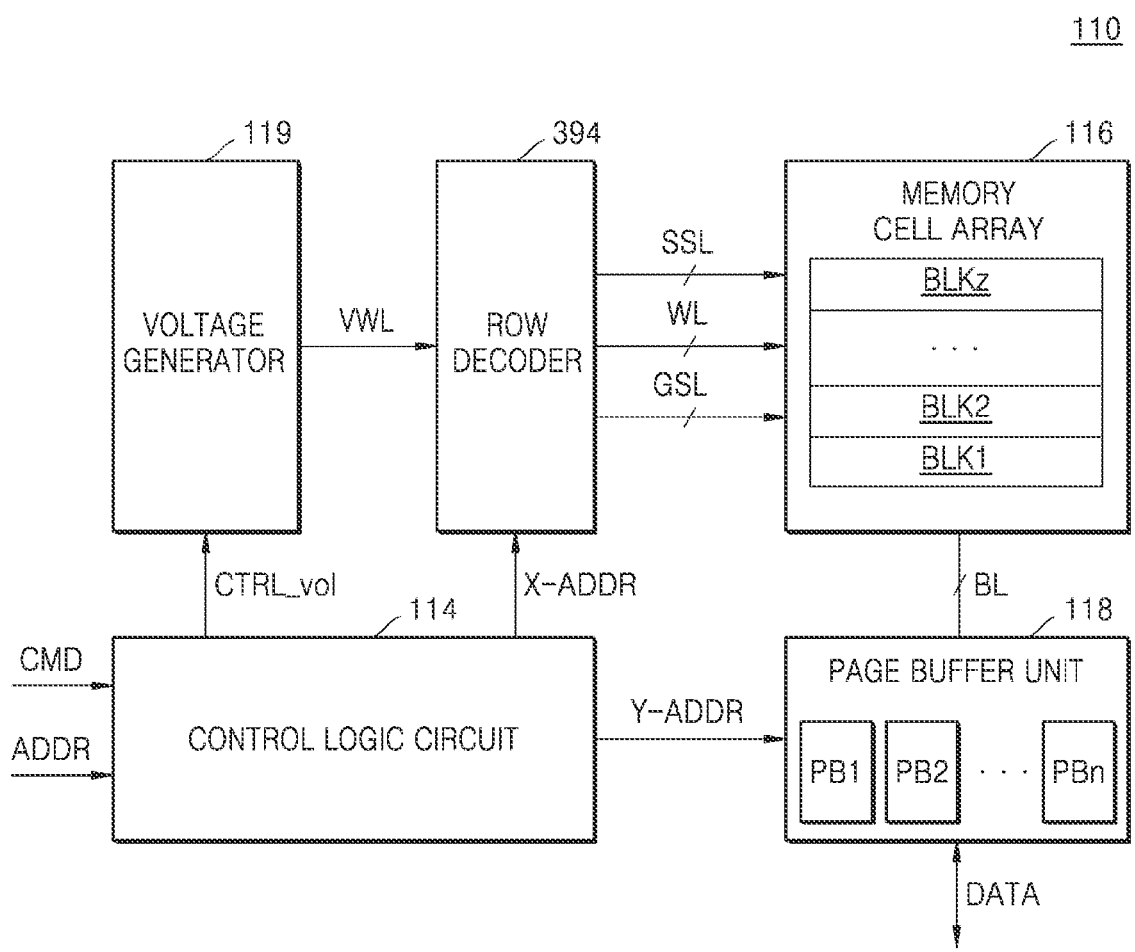
FIG. 2 illustrates an example block diagram of a memory device of FIG. 1.

FIG. 2 illustrates an example block diagram of the memory device of FIG. 1.

Referring to FIG. 2, the memory device 110 may include the control logic circuit 114, the memory cell array 116, a page buffer unit 118, a voltage generator 119, and a row decoder 394. Although not shown in FIG. 2, the memory device 110 may further include the memory interface circuit 112 shown in FIG. 1 and may further include a column logic circuit, a pre-decoder, a temperature sensor, a command decoder, and an address decoder, among other circuits.

The control logic circuit 114 may generally control various operations of the memory device 110. The control logic circuit 114 may output various control signals in response to the command CMD and/or the address ADDR from the memory interface circuit 112. For example, the control logic circuit 114 may output a voltage control signal CTRL_vol, a row address X-ADDR, and a column address Y-ADDR.

The memory cell array 116 may include a plurality of memory blocks BLK1 to BLKz (z is a positive integer), and each of the plurality of memory blocks BLK1 to BLKz may include a plurality of memory cells. The memory cell array 116 may be connected to the page buffer unit 118 through bit lines BL and may be connected to the row decoder 394 through word lines WL, string select lines SSL, and ground select lines GSL.

In an example embodiment, the memory cell array 116 may include a three-dimensional (3D) memory cell array, and the 3D memory cell array may include a plurality of NAND strings. Each of the NAND strings may include memory cells connected to the word lines vertically stacked on a substrate. U.S. Pat. Nos. 7,679,133, 8,553,466, 8,654, 587, 8,559,235, and U.S. Patent Application Publication No. 2011/0233648 are incorporated herein by reference. In some other example embodiments, the memory cell array 116 may include a two-dimensional (2D) memory cell array, and the 2D memory cell array may include a plurality of NAND strings arranged in row and column directions.

The page buffer unit 118 may include a plurality of page buffers PB1 to PBn (n is an integer of 3 or more), and the plurality of page buffers PB1 to PBn may be connected to the memory cells, respectively, through a plurality of bit lines BL. The page buffer unit 118 may select at least one of the plurality of bit lines BL in response to the column address Y-ADDR. The page buffer unit 118 may operate as a write driver or a sense amplifier according to an operation mode. For example, during a program operation, the page buffer unit 118 may apply a bit line voltage corresponding to data to be programmed to the selected bit line. During a read operation, the page buffer unit 118 may sense data stored in a memory cell by sensing a current or a voltage of a selected bit line.

The voltage generator 119 may generate various voltages for performing the program operation, the read operation, and an erase operation based on the voltage control signal CTRL_vol. For example, the voltage generator 119 may generate a program voltage, a read voltage, a program verification voltage, and an erase voltage, among other voltages, as a word line voltage VWL.

The row decoder 394 may select one of a plurality of word lines WL in response to the row address X-ADDR and may select one of a plurality of string select lines SSL. For example, during a program operation, the row decoder 394 may apply a program voltage and a program verification voltage to the selected word line and may apply a read voltage to the selected word line during a read operation.

Figure 3:
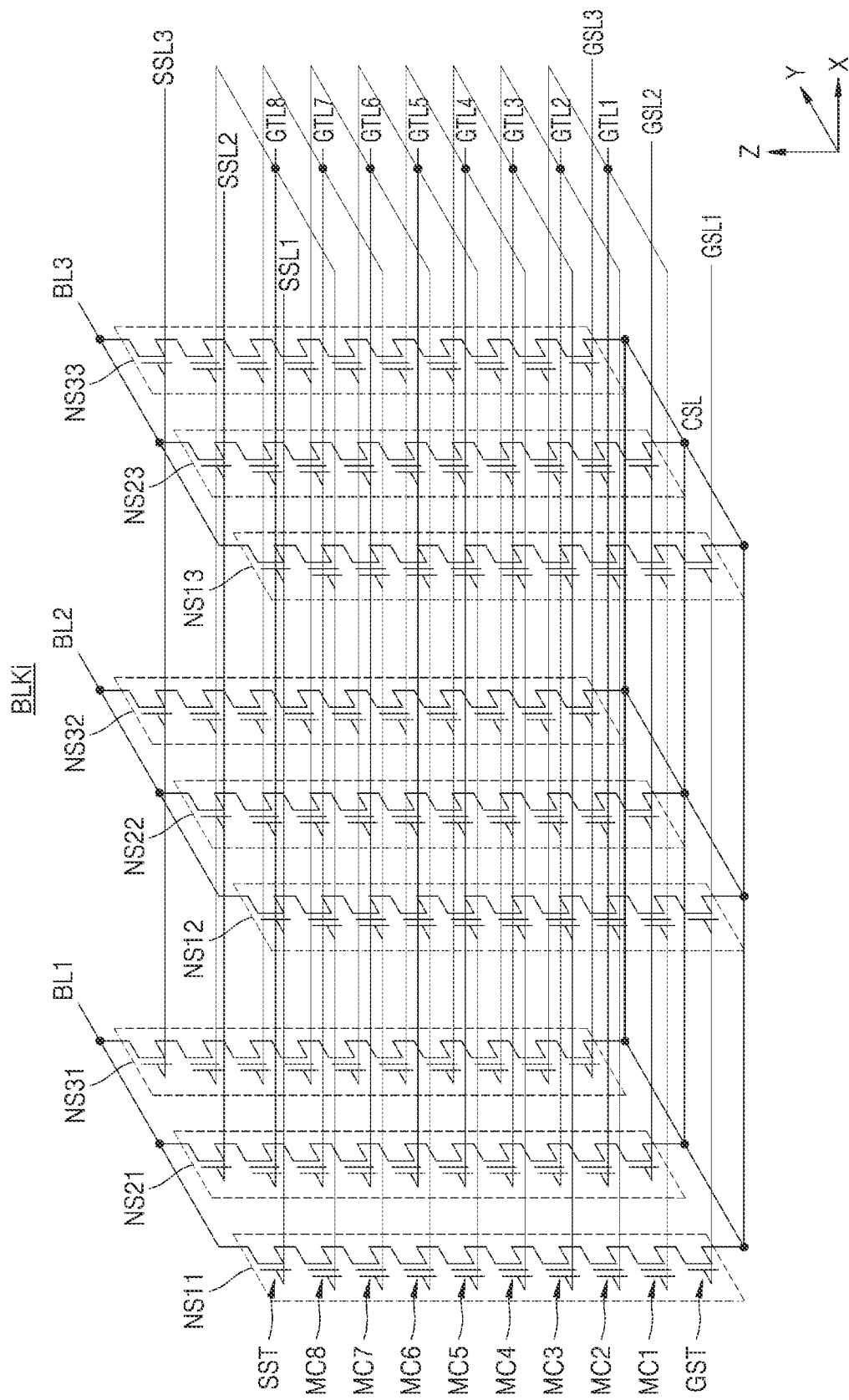
FIG. 3 illustrates a circuit diagram of a three-dimensional (3D) V-NAND structure applicable to the memory device of FIG. 2.
Figure 4:
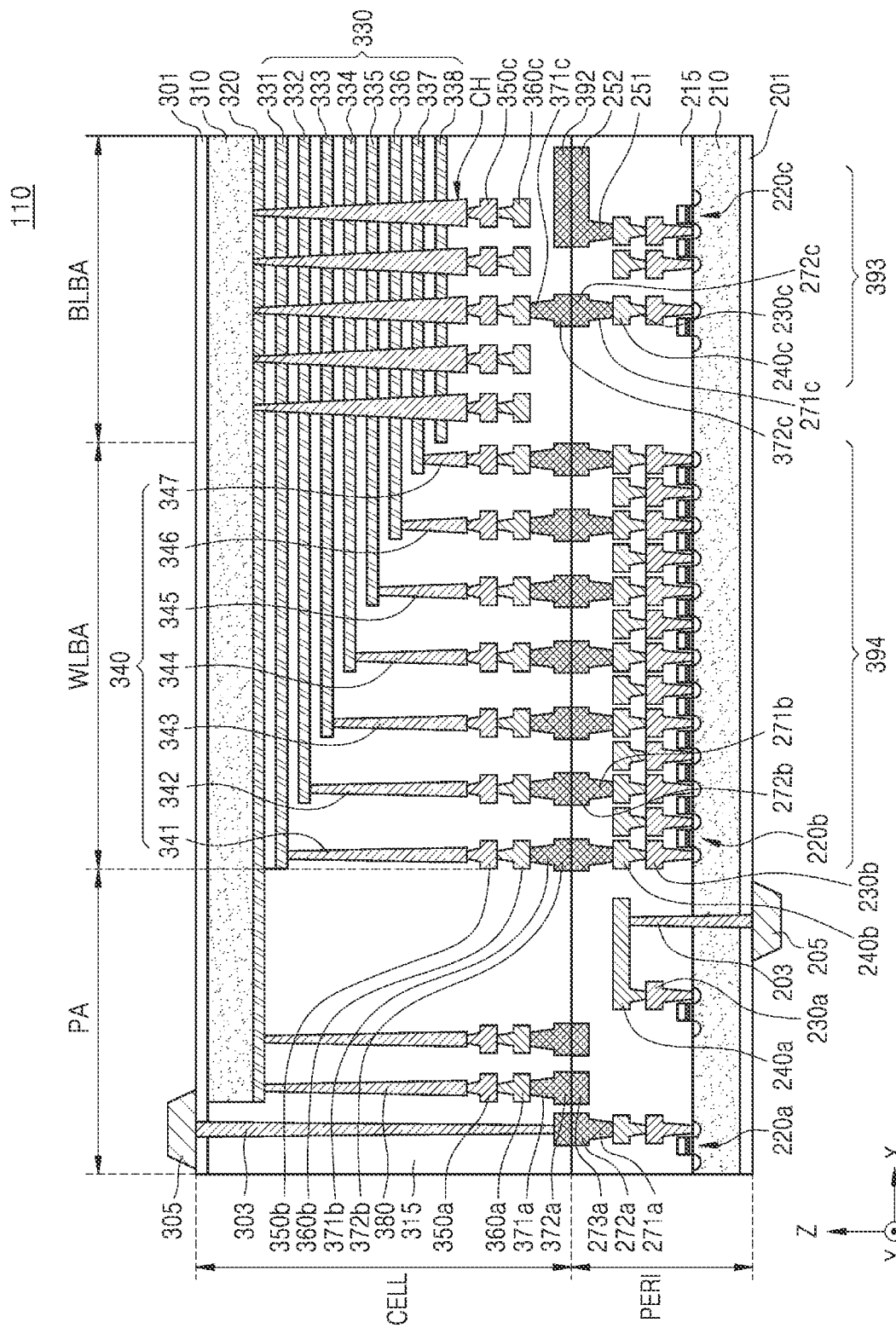
FIG. 4 illustrates a cross-sectional view of a three-dimensional (3D) V-NAND structure applicable to the memory device of FIG. 2.

FIGS. 3 and 4 are diagrams illustrating a 3D V-NAND structure applicable to the memory device of FIG. 2. When the storage device 100 of FIG. 1 is constituted by a 3D V-NAND flash memory, each of a plurality of memory blocks constituting the storage device 100 may be represented by an equivalent circuit as illustrated in FIG. 3.

A memory block BLKi illustrated in FIG. 3 represents a 3D memory block formed on a substrate in a 3D structure. For example, a plurality of memory NAND strings included in the memory block BLKi may be formed in a direction perpendicular to the substrate.

Referring to FIG. 3, the memory block BLKi may include a plurality of memory NAND strings NS11 to NS33 connected between the bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. FIG. 3 illustrates that each of the plurality of memory NAND strings NS11 to NS33 includes eight memory cells MC1, MC2, . . . , MC8, but the number of memory cells is not limited thereto.

The string selection transistor SST may be connected to the corresponding string select lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to the word lines, and some of the gate lines GTL1, GTL2, . . . , GTL8 may correspond to dummy word lines. The ground selection transistor GST may be connected to corresponding ground select lines GSL1, GSL2, and GSL3. The string select transistor SST may be connected to the corresponding bit lines BL1, BL2, and BL3, and the ground select transistor GST may be connected to the common source line CSL.

The word lines (for example, WL1) having the same height are connected in common, and the ground select lines GSL1, GSL2, and GSL3 and the string select lines SSL1, SSL2, and SSL3 may be separated from each other. FIG. 3 illustrates that the memory block BLK is connected to eight gate lines GTL1, GTL2, . . . , GTL8 and three bit lines BL1, BL2, and BL3, but the number of gate lines and bit lines is not limited thereto.

FIG. 4 illustrates a cross-sectional view of a memory device 110 of FIG. 3 according to embodiments of the inventive concepts.

Referring to FIG. 4, a memory device 110 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, in some embodiments the bonding metals may include copper (Cu) using a Cu-to-Cu bonding, but in other embodiments the bonding metals may for example be formed of aluminum (Al) or tungsten (W).

Each of the peripheral circuit region PERI and the cell region CELL of the memory device 110 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In the example embodiment illustrated in FIG. 4, although only the first metal layers 230a, 230b, and 230c and the second metal layers 240a, 240b, and 240c are shown and described, in other embodiments one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 4, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA. The common source line contact plug 380 may be connected to lower metal pattern 273a of the peripheral circuit region PERI through upper bonding metal 371a and upper metal pattern 372a.

Input-output pads 205 and 305 may be disposed in the external pad bonding area PA. Referring to FIG. 4, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film (not shown) may be disposed between the first input-output contact plug 203 and the first substrate 210 to electrically separate the first input-output contact plug 203 and the first substrate 210.

Referring to FIG. 4, an upper insulating film 301 covering the upper surface of the second substrate 310 may be formed on the second substrate 310, and the second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303 and lower bonding metals 271a and 272a. In the example embodiment, the second input-output pad 305 is electrically connected to a circuit element 220a.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 4, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 110 may include only the first input-output pad 205 disposed on the first substrate 210 or the second input-output pad 305 disposed on the second substrate 310. Alternatively, the memory device 110 may include both the first input-output pad 205 and the second input-output pad 305.

A metal pattern (not shown) provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 110 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL. The upper metal pattern 392 may be connected to the circuit elements 220c through the lower metal pattern 252 and the lower bonding metal 251.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 5:
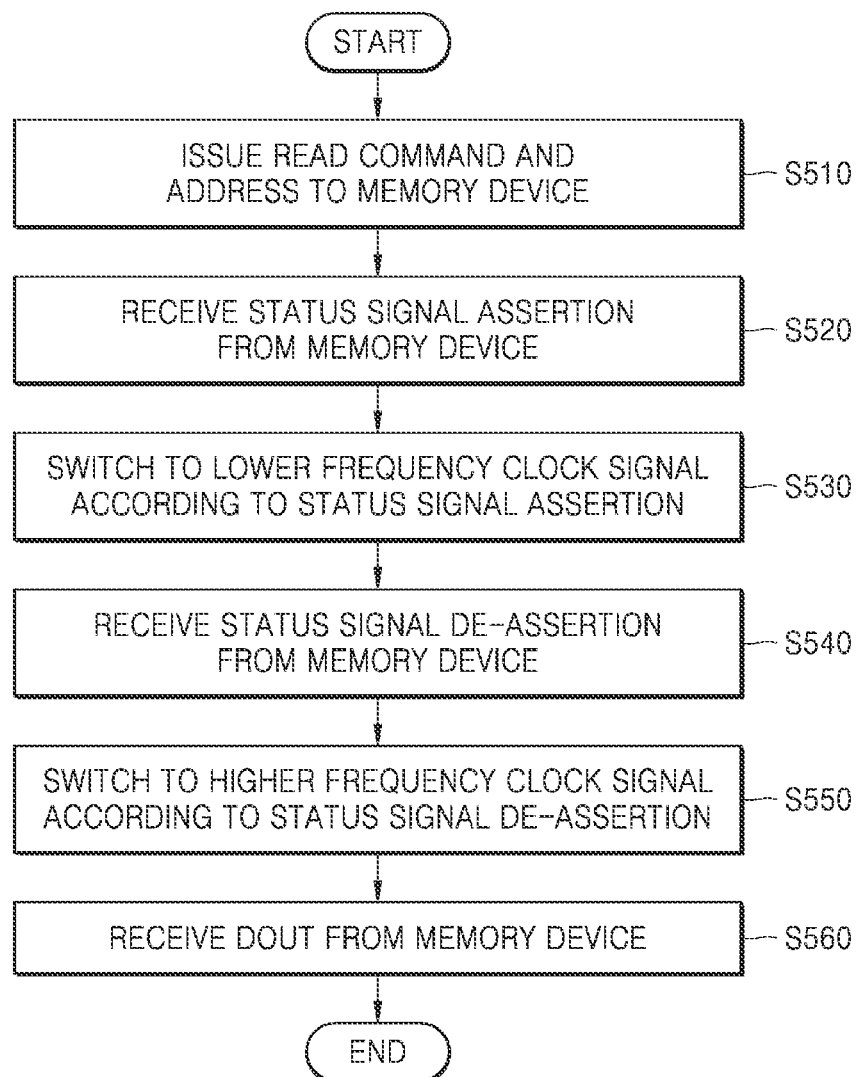
FIG. 5 illustrates a flowchart descriptive of a method of operating a storage device according to embodiments of the inventive concepts.

FIG. 5 illustrates a flowchart descriptive of a method of operating a storage device according to embodiments of the inventive concepts. FIG. 5 illustrates an operation of the memory controller 120 in the storage device 100 of FIG. 1.

Referring to FIGS. 1 to 5, in step S510, the memory controller 120 issues a read command READ CMD to the memory device 110. The memory controller 120 may transmit the address ADDR and the read command READ CMD to the memory device 110. The memory device 110 may perform a read operation of memory cells corresponding to the address ADDR in the memory cell array 116 in response to the read command READ CMD.

In step S520, the memory controller 120 receives a status signal indicating a status of the memory device 110 from the memory device 110. The status signal asserts or de-asserts that internal operations of the memory device 110 (for example, a read operation, a program operation, and an erase operation) are performed. According to an embodiment, the memory controller 120 may issue a status check command to the memory device 110, and the memory device 110 may transmit a status signal to the memory controller 120 in response to the status check command.

The memory device 110 may indicate a status in which the memory device 100 is performing a read operation by using the ready-busy output signal R/nB. The memory device 110 may transmit the ready-busy output signal R/nB indicating a busy status (for example, a low level) to the memory controller 120. The ready-busy output signal R/nB may be referred to as a status signal. In the following embodiments, the term "ready-busy output signal R/nB" and the term "status signal" may be used interchangeably.

In step S530, the memory controller 120 switches the clock signal CLK to the clock signal CLK having a low frequency according to assertion of the status signal of step S520. When a status signal is asserted from the memory device 110, in other words, when the memory device 100 is performing an internal operation, the memory controller 120 and the memory device 110 are not required to perform the best circuit performance. In general, it is necessary to acquire the best capability by increasing a frequency of the clock signal CLK, but when the best performance is not required, the frequency of the clock signal CLK needs to be switched to a low frequency to conserve power.

The memory controller 120 may switch the clock signal CLK to the clock signal CLK having a low frequency according to the ready-busy output signal R/nB indicating a busy status received from the memory device 110. While the memory device 110 transmits the ready-busy output signal R/nB indicative of a busy status, the control logic circuit 114 may perform a page read operation for memory cells corresponding to the address ADR from the memory cell array 116 according to the read command READ CMD.

In step S540, the memory controller 120 receives a de-asserted status signal from the memory device 110. After completing the page read operation, the memory device 110 transmits the ready-busy output signal R/nB indicating a ready status (for example, a high level) to the memory controller 120 to transmit the data DATA that is page-read to the memory controller 120. The ready-busy output signal R/nB in the ready status may be referred to as a de-asserted status signal.

In step S550, the memory controller 120 switches the clock signal CLK to a clock signal CLK having a high frequency according to the de-asserted status signal in step S540. When the status signal is de-asserted from the memory device 110, the memory device 100 may transmit the data DATA that is page-read to the memory controller 120 through a data signal DQ line. In this case, the memory device 110 is required to output the data DATA that is page-read as output data DOUT at the best capability. For the best capability of the memory controller 120 and the memory device 110, the frequency of the clock signal CLK needs to be switched to a high frequency. The memory controller 120 may switch the clock signal CLK to a clock signal CLK having a high frequency according to the ready-busy output signal R/nB indicative of a ready status received from the memory device 110.

In step S560, the memory controller 120 receives the output data DOUT of the memory device 110 through the data signal DQ line in response to the read command READ CMD and the address ADDR issued in step S510.

Figure 6A:
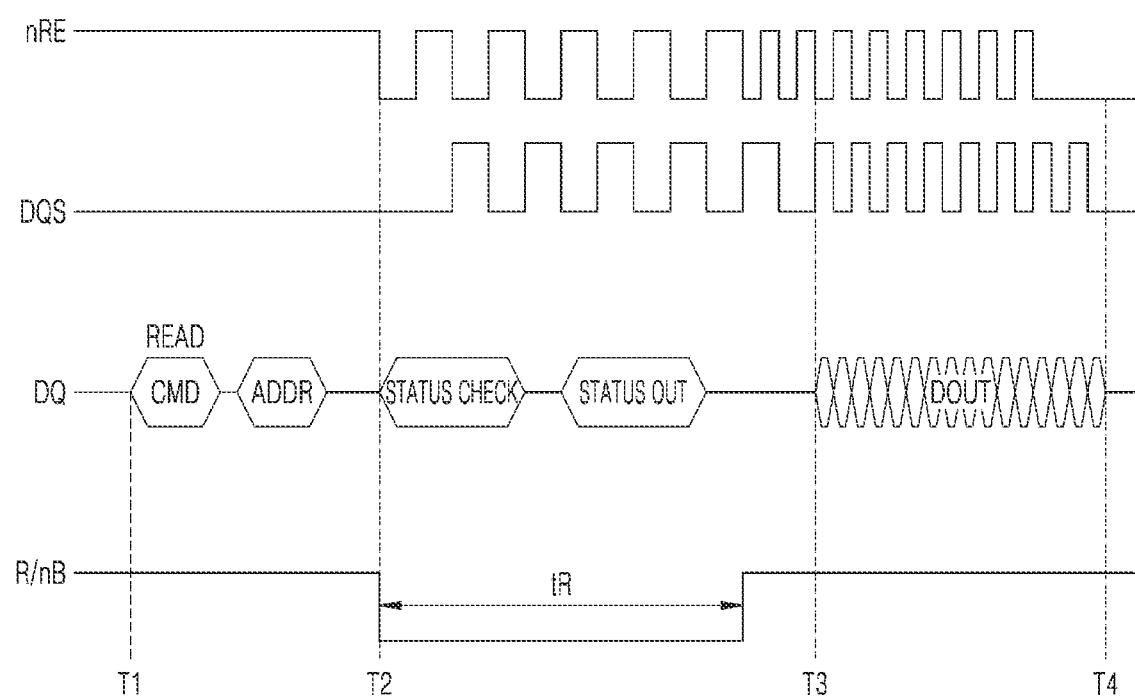
FIG. 6A illustrates a timing diagram of a read operation in a storage device according to embodiments of the inventive concepts.

FIGS. 6A and 6B illustrate diagrams of a method of operating a storage device according to embodiments of the inventive concepts. FIG. 6A illustrates a timing diagram of a read operation of the memory device 110 in the storage device 100 of FIG. 1, and FIG. 6B illustrates a chart of a page read operation of the memory device 110. It is noted that the horizontal axis and the vertical axis in FIGS. 6A and 6B respectively represent time and voltage levels, and that FIGS. 6A and 6B are not illustrated to scale.

Referring to FIGS. 1 to 6A, the read command READ CMD may be received through the data signal DQ line at a point in time T1 to perform a read operation for the memory device 110. Following the read command READ CMD, the address ADDR may be received through the data signal DQ line.

At a point in time T2, a status check signal STATUS CHECK for a read operation may be received through the data signal DQ line. The status check signal STATUS CHECK may be provided to check a read operation status of the memory device 110 according to the read command READ CMD. The status check signal STATUS CHECK may be referred to as a read status check command. The status check signal STATUS CHECK may be received together with the read enable signal nRE that is toggled at a first frequency. The read enable signal nRE may be received in a toggled status from a fixed status (for example, a high level). The memory device 110 may generate the data strobe signal DQS according to the read enable signal nRE that is toggled at the received first frequency. The data strobe signal DQS may be generated from a fixed status (for example, a low level) to a toggled status of the first frequency. The read enable signal nRE and the data strobe signal DQS that are toggled at the first frequency may be generated based on the clock signal CLK which is generated by the memory controller 120 and switched to a low frequency in step S530, and may be provided to the memory device 110 for a read operation. According to an embodiment, the read enable signal nRE and the data strobe signal DQS that are toggled at the first frequency may be toggled at the same clock frequency as the clock signal CLK having a low frequency.

The memory device 110 may transmit a status output signal STATUS OUT indicating that a read operation is performed to the memory controller 120 through the data signal DQ line in response to the status check signal STATUS CHECK. The memory device 110 may repeatedly transmit the status check signal STATUS CHECK, and receive the status output signal STATUS OUT corresponding to the status check signal STATUS CHECK.

Meanwhile, the memory controller 120 may use the ready-busy output signal R/nB which is output from the memory device 110 to check a read operation status of the memory device 110 instead of transmitting the status check signal STATUS CHECK and receiving the status output signal STATUS OUT corresponding to the status check signal STATUS CHECK through the data signal DQ line. At the point in time T2, the memory device 110 may transmit the ready-busy output signal R/nB indicating a busy status (for example, a low level) to the memory controller 120. The ready-busy output signal R/nB may be outputted as a busy status during a period tR in which the memory device 110 performs a read operation.

One or more bits may be programmed to a memory cell of the memory cell array 116. The memory cell may be classified as a single level cell (SLC), a multi-level cell (MLC), a triple level cell (TLC), or a quad-level cell (QLC) according to the number of bits stored in the memory cell. The memory cell may have a plurality of statuses according to the number of bits stored in the memory cell. The plurality of statuses may be defined in a range of a threshold voltage. For example, when each of the memory cells is a QLC, a status of each of the memory cells may correspond to one of 16 statuses S1 to S16, as illustrated in FIG. 6B. The memory cells connected to one word line WL may include a least significant bit LSB page, a first middle bit CSB1 page, a second middle bit CSB2 page, and a most significant bit MSB page.

A read operation of the memory device 110 may include an operation of detecting valley positions VR1 to VR15 of a threshold voltage of the memory cell, an operation of inferring best read voltages RD1 to RD15 based on the valley positions VR1 to VR15, a page read operation for each of a least significant bit LSB page, a first middle bit CSB1 page, a second middle bit CSB2 page, and a most significant bit MSB page using the read voltages RD1 to RD15, and so on.

For example, during a read operation for the least significant bit LSB page, the memory device 110 may determine the eleventh and twelfth statuses S11 and S12 by applying the eleventh read voltage RD11 to the select word line WL, and then may determine the sixth and seventh statuses S6 and S7, the fourth and fifth statuses S4 and S5, and the first and second statuses S1 and S2 by sequentially applying the sixth read voltage RD6, the fourth read voltage RD4, and the first read voltage RD1 to the select word line WL. During a read operation for the first intermediate bit CSB1 page, the memory device 110 may determine the thirteenth and fourteenth statuses S13 and S14, the ninth and tenth statuses S9 and S10, the seventh and eighth statuses S7 and S8, and the third and fourth statuses S3 and S4 by sequentially applying the thirteenth read voltage RD13, the ninth read voltage RD9, the seventh read voltage RD7, and the third read voltage RD3 to the select word line WL. During a read operation for the second intermediate bit CSB2 page, the memory device 110 may determine the fourteenth and fifteenth statuses S14 and S15, the eighth and ninth statuses S8 and S9, and the second and third statuses S2 and S3 by sequentially applying the fourteenth read voltage RD14, the eighth read voltage RD8, and the second read voltage RD2 to the select word line WL. During a read operation for the most significant bit MSB page, the memory device 110 may determine the fifteenth and sixteenth statuses S15 and S16, the twelfth and thirteenth statuses S12 and S13, the tenth and eleventh statuses S10 and S11, and the fifth and sixth statuses S5 and S6 by sequentially applying the fifteenth read voltage RD15, the twelfth read voltage RD12, the tenth read voltage RD10, and the fifth read voltage RD5 to select word line WL. During the period tR in which the page read operation is performed, the ready-busy output signal R/nB may be outputted as a busy status.

In FIG. 6A, when the page read operation of the memory device 110 is completed, the status output signal STATUS OUT indicating that the page read operation is completed in response to the status check signal STATUS CHECK may be transmitted to the memory controller 120 through the data signal DQ line. Alternatively, the ready-busy output signal R/nB indicating a ready status (for example, a high level) of the memory device 110 may be transmitted to the memory controller 120. The memory controller 120 may transmit the read enable signal nRE to the memory device 110 based on the status output signal STATUS OUT or the ready-busy output signal R/nB. The memory device 110 may receive the read enable signal nRE that is toggled at a second frequency. The read enable signal nRE that is toggled at the second frequency may be generated and provided based on the clock signal CLK that is generated by the memory controller 120 and switched to a high frequency in step S550. According to an embodiment, the read enable signal nRE that is toggled at the second frequency may be toggled at the same clock frequency as the clock signal CLK having a high frequency.

At a point in time T3, the memory device 100 may transmit the data DATA page-read by a page read operation to the memory controller 120 through the data signal DQ line as the output data DOUT. The output data DOUT may be transmitted to the memory controller 120 together with the data strobe signal DQS. The memory device 110 may generate the data strobe signal DQS based on the read enable signal nRE that is toggled at the second frequency to be received by the memory controller 120 from the point in time T3 to a point in time T4, and may transmit the output data DOUT synchronized with the data strobe signal DQS to the memory controller 120. The data strobe signal DQS may be toggled at the same clock frequency as the clock signal CLK having a high frequency in the same manner as the read enable signal nRE that is toggled at the second frequency. Accordingly, the memory controller 120 may acquire the output data DOUT according to a high frequency toggle timing of the data strobe signal DQS.

Figure 7:
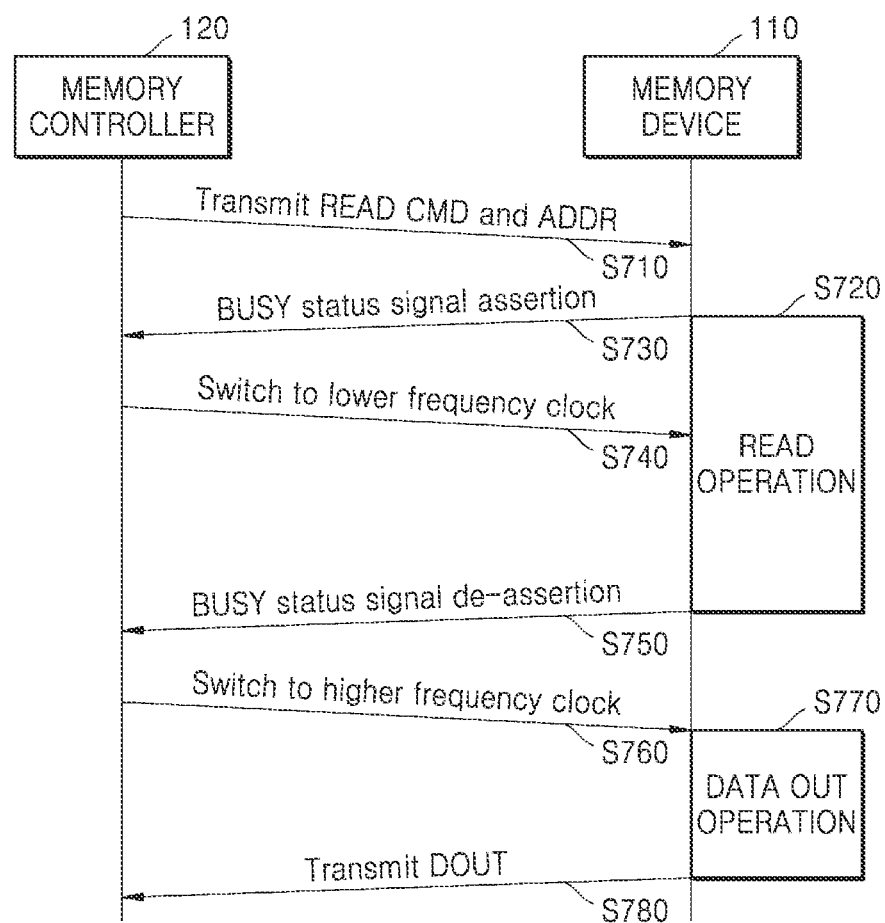
FIG. 7 illustrates a flowchart descriptive of a method of operating a storage device according to embodiments of the inventive concepts.

FIG. 7 illustrates a flowchart descriptive of a method of operating a storage device according to embodiments of the inventive concepts. FIG. 7 illustrates a read operation between the memory controller 120 and the memory device 110 of FIG. 1.

Referring to FIGS. 1 to 7, in step S710, the memory controller 120 transmits the read command READ CMD and the address ADDR to the memory device 110.

In step S720, the memory device 110 performs the read operation for memory cells corresponding to the address ADDR in the memory cell array 116 in response to the read command READ CMD. For example, when each of the memory cells is a QLC, the read operation of the memory device 110 may include an operation of detecting valley positions of a threshold voltage of the memory cell, an operation of inferring best read voltage levels based on the valley positions, a page read operation for each of a least significant bit LSB page, a first middle bit CSB1 page, a second middle bit CSB2 page, and a most significant bit MSB page using the read voltage levels, and so on.

In step S730, the memory device 110 asserts a busy status signal indicating that a read operation is performed. The memory device 110 may transmit the ready-busy output signal R/nB indicating a busy status (for example, a low level) to the memory controller 120. The ready-busy output signal R/nB may be outputted in a busy status during the period tR (e.g., see FIG. 6) in which the memory device 110 performs the read operation.

In step S740, the memory controller 120 switches the clock signal CLK to the clock signal CLK having a low frequency according to the assertion of the busy status signal in step S730. The memory controller 120 may transmit the read enable signal nRE and the data strobe signal DQS that are toggled at the first frequency to the memory device 110 based on the clock signal CLK switched to a low frequency. The read enable signal nRE and the data strobe signal DQS that are toggled at the first frequency may be toggled to the same clock frequency as the clock signal CLK having a low frequency.

In step S750, the memory device 110 de-asserts the busy status signal after completing the read operation (S720). The memory device 110 transmits the ready-busy output signal R/nB indicating a ready status (for example, a high level) to the memory controller 120.

In step S760, the memory controller 120 switches the clock signal CLK to the clock signal CLK having a high frequency according to de-assertion of the received busy status signal. The memory controller 120 may transmit the read enable signal nRE that is toggled at the second frequency to the memory device 110.

In step S770, the memory device 110 performs a data output operation of outputting the data DATA that is page-read in the read step S720 as the output data DOUT. The memory device 110 may generate the data strobe signal DQS that is toggled at the second frequency based on the read enable signal nRE that is toggled at the received second frequency.

In step S780, the memory device 110 transmits the output data DOUT synchronized with the data strobe signal DQS that is toggled at the second frequency to the memory controller 120.

Figure 8:
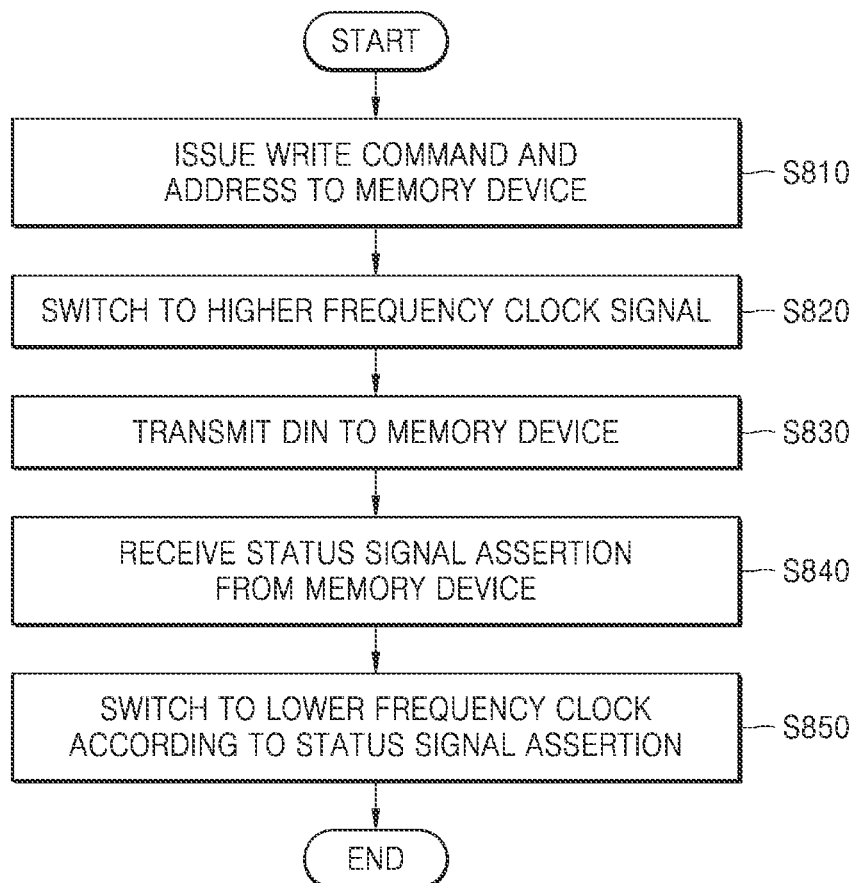
FIG. 8 illustrates a flowchart descriptive of a method of operating a storage device according to embodiments of the inventive concepts.

FIG. 8 illustrates a flowchart illustrating a method of operating a storage device according to embodiments of the inventive concepts. FIG. 8 illustrates an operation of the memory controller 120 in the storage device 100 of FIG. 1.

Referring to FIGS. 1 to 4, and FIG. 8, in step S810, the memory controller 120 transmits the address ADDR and a write command WRITE CMD to the memory device 110. The memory device 110 may perform a write (or program) operation on memory cells corresponding to the address ADDR in the memory cell array 116 in response to the write command WRITE CMD.

In step S820, the memory controller 120 switches the clock signal CLK to the clock signal CLK having a high frequency to transmit write data DIN to the memory device 110.

In step S830, the memory controller 120 transmits the write data DIN to the memory device 110. The memory controller 120 may generate the data strobe signal DQS based on the clock signal CLK having a high frequency and may transmit the write data DIN synchronized with the data strobe signal DQS to the memory device 110. The data strobe signal DQS may be toggled at the same clock frequency as the clock signal CLK having a high frequency. The memory controller 120 may transmit the write data DIN to the memory device 110 according to a high frequency toggle timing of the data strobe signal DQS.

In step S840, the memory controller 120 receives a status signal indicating a status of the memory device 110 from the memory device 110. The memory device 110 may indicate by using the ready-busy output signal R/nB a status in which the memory device 100 performs a program operation. The memory device 110 may transmit the ready-busy output signal R/nB indicating a busy status (for example, a low level) to the memory controller 120.

In step S850, the memory controller 120 switches the clock signal CLK to the clock signal CLK having a low frequency according to assertion of the status signal indicating a busy status of step S840. The memory controller 120 may transmit the data strobe signal DQS that is toggled at the same clock frequency as the clock signal CLK having a low frequency to the memory device 110 based on the clock signal CLK having a low frequency. The data strobe signal DQS changed by the low frequency toggle timing may be provided during a period tPROG in which the memory device 110 performs a program operation. The program section tPROG of the memory device 110 may include for example a channel precharge section, a bit line setup section, a string select line setup section, a program execution section, and a program verification section.

Figure 9A:
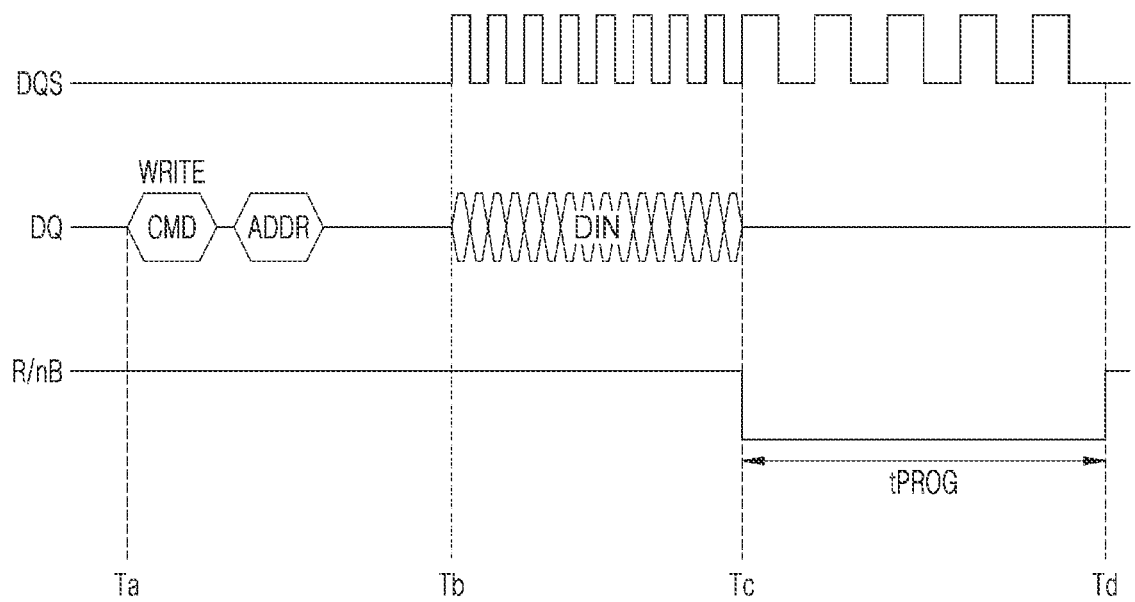
Figure 9C:
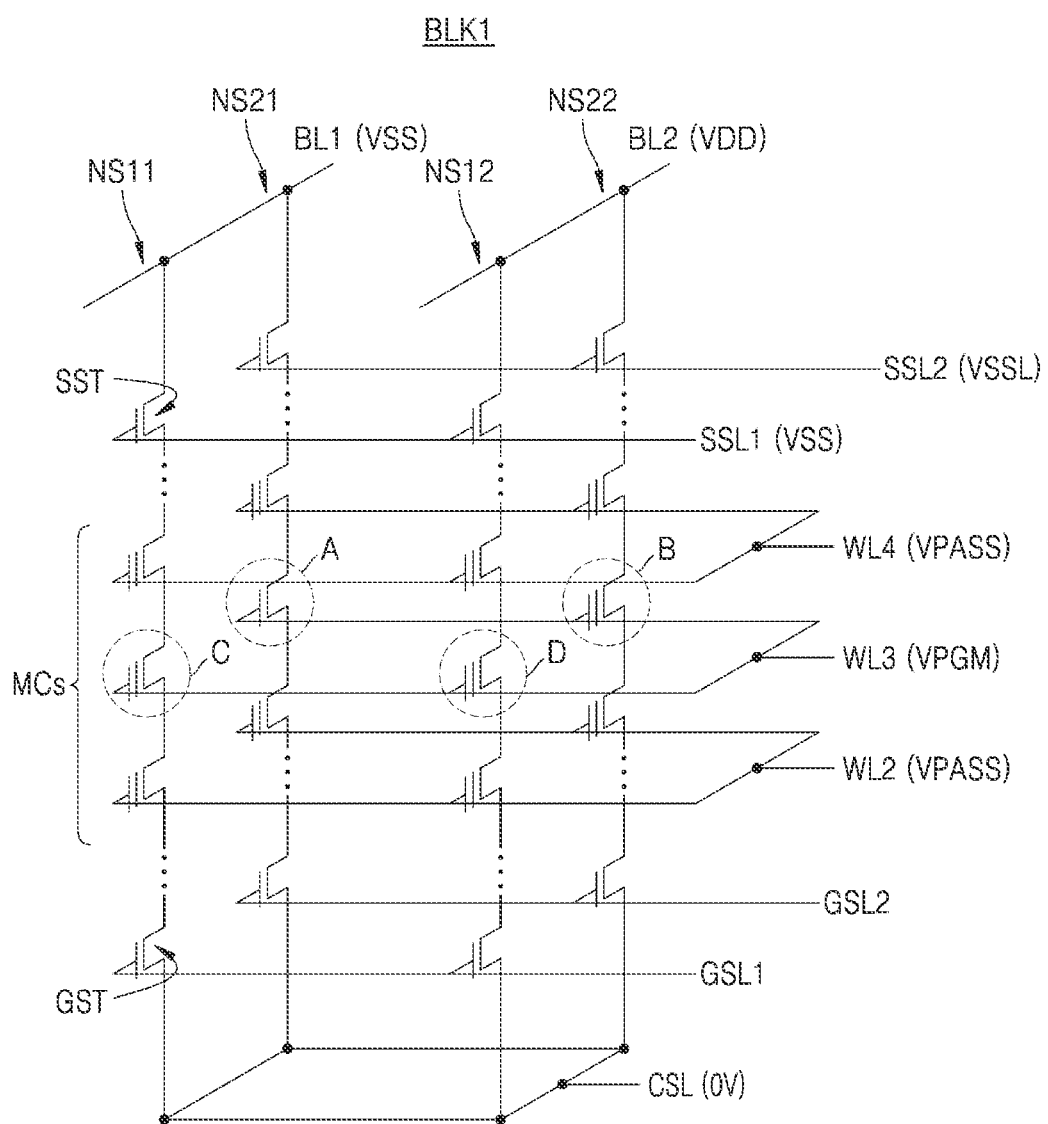
FIG. 9C illustrates an example program bias condition of a memory device in FIG. 1.
Figure 9D:
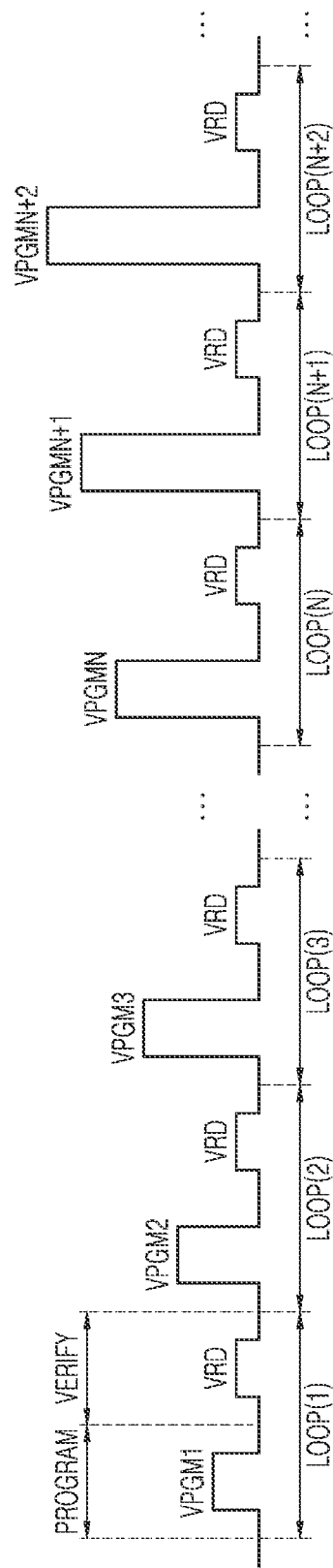
FIG. 9D illustrates a chart of incremental step programming of a memory device in FIG. 1.

FIGS. 9A to 9D illustrate diagrams descriptive of a method of operating a storage device according to embodiments of the inventive concepts. FIGS. 9A and 9B illustrate timing diagrams of the program operation of the memory device 110 in the storage device 100 of FIG. 1, FIG. 9C illustrates a diagram of an example program bias condition of the memory device 110, and FIG. 9D illustrates a chart descriptive of incremental step pulse programming (hereinafter, referred to as "ISPP") of the memory device 110.

Referring to FIGS. 1 to 4, 8, and 9A, the write command WRITE CMD may be received through the data signal DQ line at a point in time Ta for a write operation of the memory device 110. Following the write command WRITE CMD, the address ADDR may be received through the data signal DQ line.

At a point in time Tb, the write data DIN for the write operation may be received through the data signal DQ line in synchronization with the data strobe signal DQS. The data strobe signal DQS may be generated based on the clock signal CLK switched to a high frequency in steps S820 and S830 of the memory controller 120 and may be provided to the memory device 110 for the write operation. According to an embodiment, the data strobe signal DQS may be toggled at the same clock frequency as the clock signal CLK having a high frequency.

At a point in time Tc, the memory device 110 may transmit, to the controller 120, the ready-busy output signal R/nB indicating a busy status (e.g., a low level) indicating that a program operation is performed in response to the write command WRITE CMD. The ready-busy output signal R/nB may be outputted as indicating a busy status during the period tPROG in which the memory device 110 performs the program operation from the point in time Tc to a point in time Td. The memory device 110 may receive the data strobe signal DQS changed to a low frequency toggle timing based on the clock signal CLK having a low frequency in step S850 of the memory controller 120. The data strobe signal DQS that is toggled at a low frequency may be received during the period tPROG in which the memory device 110 performs the program operation.

Referring to FIG. 9B, in some embodiments the status check signal STATUS CHECK for a write operation may be received at the memory device 110 through the data signal DQ line at a point in time Tcd between the point in time Tc and a point in time Td, when compared with FIG. 9A. The memory controller 120 may transmit the status check signal STATUS CHECK to the memory device 110 through the data signal DQ line to check a program operation status of the memory device 110. In this case, the memory device 110 may not provide a function of outputting the ready-busy output signal R/nB indicating a status of the memory device 110.

The memory device 110 may transmit the status output signal STATUS OUT indicating that a program operation is performed to the memory controller 120 through the data signal DQ line in response to the status check signal STATUS CHECK. The memory device 110 may repeatedly receive the status check signal STATUS CHECK and transmit the status output signal STATUS OUT corresponding to the status check signal STATUS CHECK.

At the point in time Tcd, the status check signal STATUS CHECK may be received together with the read enable signal nRE that is toggled at a low frequency. The memory device 110 may generate the data strobe signal DQS according to the read enable signal nRE that is toggled at the received low frequency. The data strobe signal DQS may be generated from a fixed status (for example, a low level) to a low frequency toggle status. The read enable signal nRE and the data strobe signal DQS that are toggled at the low frequency may be toggled to the same clock frequency as the clock signal CLK having a low frequency generated in step S530 of the memory controller 120.

For example, when each of the memory cells is a QLC, a status of each of the memory cells may be programmed to one of 16 statuses S1 to S16, as illustrated in FIG. 6B. FIG. 9C illustrates the NAND strings NS11 and NS21 connected to the first bit line BL1 and the NAND strings NS12 and NS22 connected to the second bit line BL2 among NAND strings NS11 to NS33 of the first memory block BLK1 of a plurality of memory blocks BLK1 to BLKz in the memory cell array 116, as shown in FIG. 3 for example. The first bit line BL1 is a program allowable bit line to which a relatively low program allowable voltage, for example, a ground voltage VSS is applied, and the second bit line BL2 is a program prohibition bit line to which a relatively high program prohibition voltage, for example, a power supply voltage VDD is applied.

Assuming that the NAND string NS21 is selected from among the NAND strings NS11 and NS21 connected to the first bit line BL1, during a program operation, a turn-off voltage at a level of the ground voltage VSS may be applied to the string select line SSL1 connected to the NAND string NS11, and a turn-on voltage VSSL greater than or equal to a threshold voltage Vth of each of the string select transistors SST, such as the power supply voltage VDD, may be applied to the string select line SSL2 connected to the NAND string NS21. The turn-off voltage at a level of the ground voltage VSS may be applied to the ground select lines GSL1 and GSL2. A precharge voltage higher than the ground voltage VSS may be applied to the source line CSL. A program voltage VPGM (for example, 18 V) may be applied to the selected word line (for example, WL3), and a pass voltage VPASS (for example, 8 V) may be applied to unselected word lines (for example, WL2 and WL4).

In this program bias condition, 18 V may be applied to a gate of a memory cell A and a channel voltage is 0 V. Because a strong electric field is formed between the gate and a channel of the memory cell A, the memory cell A is programmed. In addition, because a channel voltage of a memory cell B is the power supply voltage VDD and a weak electric field is formed between a gate and the channel of the memory cell B, the memory cell B is not programmed Because channels of memory cells C and D are in a floating status, channel voltages thereof increase to a boosting level by the pass voltage VPASS, and the memory cells C and D are not programmed.

The program operation of the memory device 110 may sequentially perform a plurality of program loops LOOP(1), LOOP(2), LOOP(3), . . . LOOP(N+2) until programming is completed according to ISPP, as illustrated in FIG. 9D. As the program loop is repeated, program voltages VPGM1, VPGM2, VPGM3, . . . VPGMN+2 may increase step by step. Each program loop LOOP(i) (i is a natural number) may include a program period PROGRAM in which the program voltages VPGM1, VPGM2, VPGM3, . . . VPGMN+2 are applied to the selected word line WL3 to program the selected memory cell, and a verification period VERIFY in which a detection read voltage VRD is applied to the selected word line WL3 to verify whether or not the programming is successful.

Figure 10:
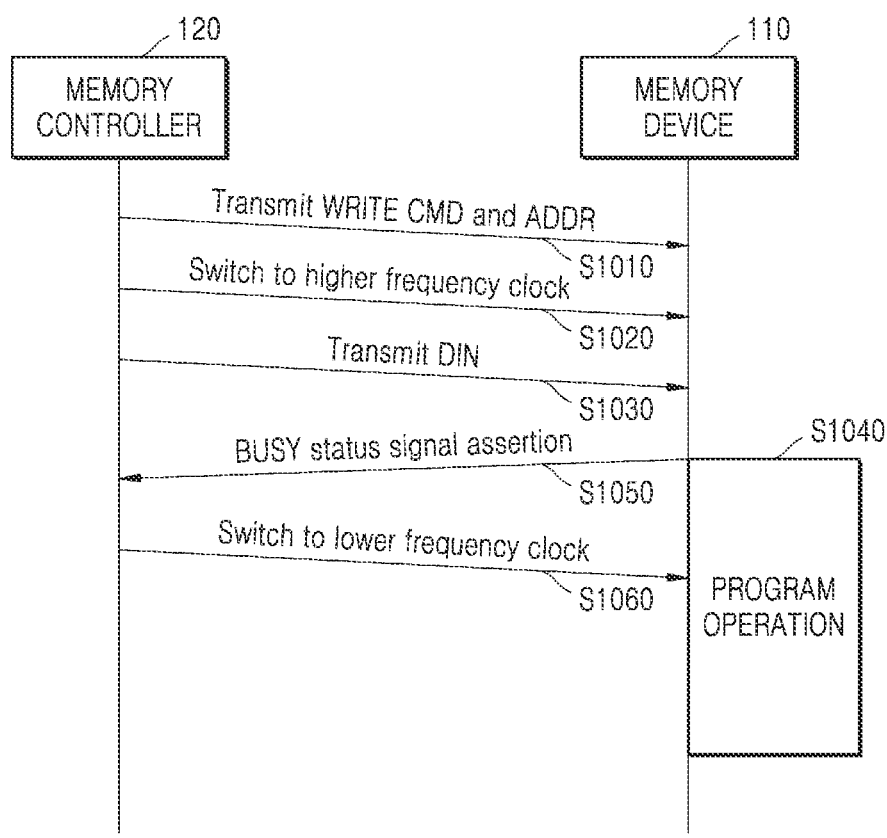
FIG. 10 illustrates a flowchart descriptive of a method of operating a storage device according to embodiments of the inventive concepts.

FIG. 10 illustrates a flowchart descriptive of a method of operating a storage device according to embodiments of the inventive concepts. FIG. 10 illustrates a write operation between the memory controller 120 and the memory device 110 of FIG. 1.

Referring to FIGS. 1 to 4 and FIGS. 8 to 9C, in step S1010, the memory controller 120 transmits the write command WRITE CMD and the address ADDR to the memory device 110.

In step S1020, the memory controller 120 switches the clock signal CLK to the clock signal CLK having a high frequency to transmit the write data DIN to the memory device 110.

In step S1030, the memory controller 120 transmits the write data DIN to the memory device 110. The memory controller 120 may generate the data strobe signal DQS based on the clock signal CLK having a high frequency and may transmit write data DIN synchronized with the data strobe signal DQS that is toggled at a high frequency to the memory device 110.

In step S1040, the memory device 110 performs a program operation on memory cells corresponding to the address ADDR in the memory cell array 116 in response to the write command WRITE CMD. The program operation of the memory device 110 sequentially performs the plurality of program loops LOOP(1), LOOP(2), LOOP(3), . . . LOOP(N+2) until programming is completed according to the ISPP, and as the program loops are repeated, the program voltages VPGM1, VPGM2, VPGM3, . . . VPGMN+2 increase step by step, and each program loop LOOP(i) (i is a natural number) may include a channel precharge operation, a bit line setup operation, a string select line setup operation, a program execution operation, and a program verification operation.

In step S1050, the memory device 110 asserts a busy status signal indicating that the program step S1040 is being performed. The memory device 110 may transmit the ready-busy output signal R/nB indicating a busy status (for example, a low level) to the memory controller 120. The ready-busy output signal R/nB may be outputted indicating a busy status during the period tPROG in which the memory device 110 performs a program step S1040.

In step S1060, the memory controller 120 switches the clock signal CLK to the clock signal CLK having a low frequency according to the assertion of the busy status signal in step S1050. The memory controller 120 may transmit the data strobe signal DQS changed at a low frequency toggle timing to the memory device 110 based on the clock signal CLK switched to a low frequency. The data strobe signal DQS that is toggled at a low frequency may be received during the period tPROG in which the memory device 110 performs the program operation (S1040).

Figure 11:
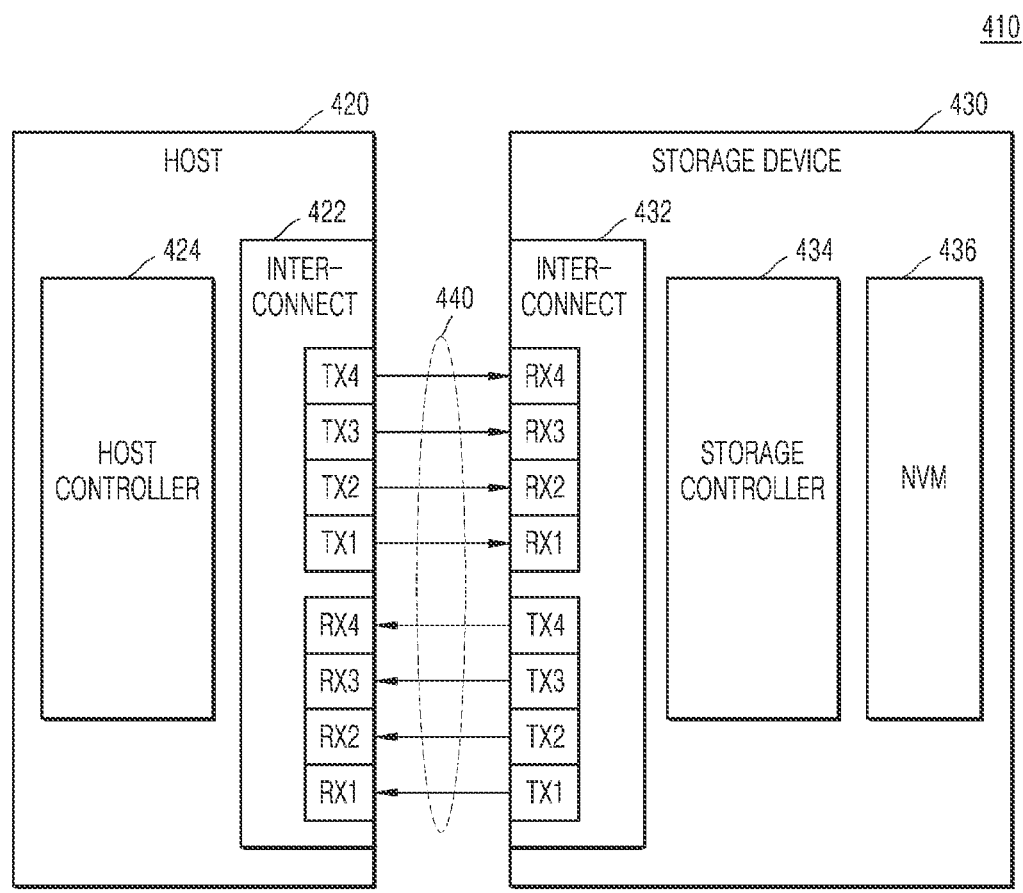
FIG. 11 illustrates a block diagram of a storage system including a storage device according to embodiments of the inventive concepts.

FIG. 11 illustrates a block diagram of a storage system including a storage device according to embodiments of the inventive concepts.

Referring to FIG. 11, a storage system 410 may include a host 420 and a storage device 430. The host 420 and the storage device 430 may be connected to each other according to an interface protocol defined in a universal flash storage (UFS) specification, and accordingly, the storage device 430 may include a UFS storage device, and the host 420 may include a UFS host. However, the inventive concepts are not limited thereto, and the storage device 430 and the host 420 may be connected to each other according to various standard interfaces. The storage device 430 may correspond to the storage device 100 described with reference to FIGS. 1 to 10.

The host 420 may control a data processing operation for the storage device 430, for example, a data read operation or a data write operation. The host 420 may indicate a data processing device capable of processing data, such as a central processing unit (CPU), a microprocessor, or an application processor (AP). The host 420 may execute an operating system (OS) and/or various applications. In one embodiment, the storage system 410 may be included in a mobile device, and the host 420 may include the application processor (AP). In one embodiment, the host 420 may include a system-on-a-chip (SoC) and, accordingly, may be embedded in an electronic device.

Although many conceptual hardware configurations included in the host 420 and the storage device 430 are described, the present embodiments are not limited thereto and may include other configurations. The host 420 may include an interconnection unit 422 and a host controller 424. The interconnection unit 422 may provide an interface 440 between the host 420 and the storage device 430. The interconnection unit 422 may include a physical layer and a link layer. The physical layer of the interconnection unit 422 may include physical configurations for exchanging data with the storage device 430, at least one transmitter TX and at least one receiver RX, and so on. The interconnection unit 422 of the host 420 may include, for example, four transmitters TX1 to TX4 and four receivers RX1 to RX4. The link layer of the interconnection unit 422 may also manage data transmission and/or composition and may manage data integrity and errors.

The storage device 430 may include an interconnection unit 432, a storage controller 434, and a nonvolatile memory (NVM) 436. The storage controller 434 may control the nonvolatile memory 436 to write data to the nonvolatile memory 436 in response to a write request from the host 420 or may control the nonvolatile memory 436 to read data stored in the nonvolatile memory 436 in response to a read request from the host 420. The storage controller 434 may correspond to the memory controller 120 described with reference to FIGS. 1 to 10, and the nonvolatile memory 436 may correspond to the memory device 110.

The interconnection unit 432 may provide the interface 440 between the storage device 430 and the host 420. For example, the interconnection unit 432 may include a physical layer and a link layer. The physical layer of the interconnection unit 432 may include physical configurations for exchanging data with the host 420 and may include at least one receiver RX, and at least one transmitter TX, and so on. The interconnection unit 432 of the storage device 430 may include, for example, four receivers RX1 to RX4 and four transmitters TX1 to TX4. The link layer of the interconnection unit 432 may also manage data transmission and/or composition and may manage data integrity and errors.

In one embodiment, when the storage system 410 is a mobile device, the physical layers of the interconnection units 422 and 432 may be defined by an "M-PHY" specification, and the link layers may be defined by a "UniPro" specification. The M-PHY specification and the UniPro specification are interface protocols proposed by a mobile industry processor interface (MIPI®) alliance. The link layers of the interconnection units 422 and 432 may each include a physical adapted layer, and the physical adapted layer may control physical layers, such as managing symbols of data or managing power.

Figure 12:
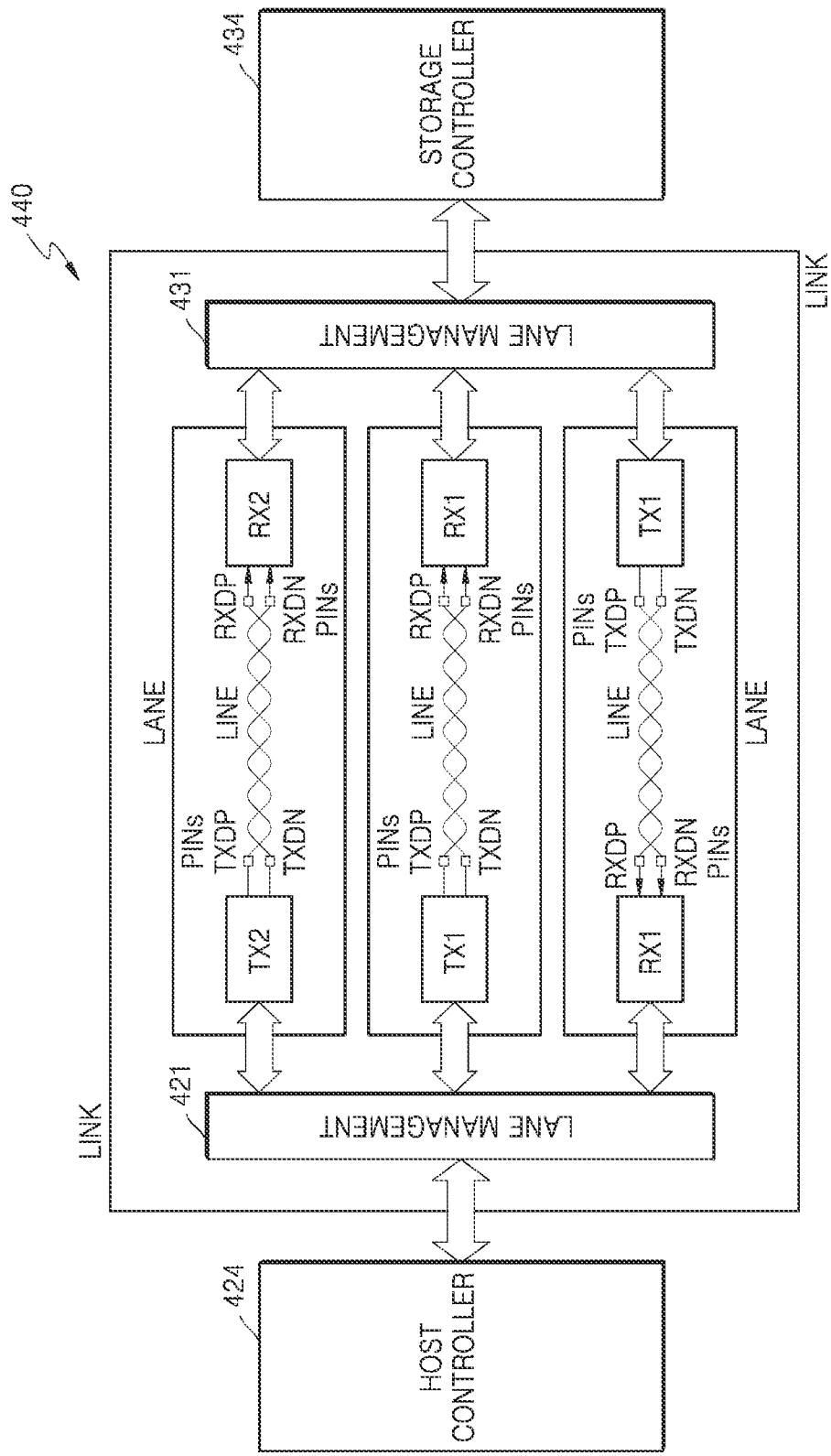
FIG. 12 illustrates a diagram of an interface between a host and the storage device of FIG. 11.

As illustrated in FIG. 12, a transmitter TX included in the interconnection unit 422 of the host 420 and a receiver RX included in the interconnection unit 432 of the storage device 430 may form one lane. In addition, a transmitter TX included in the interconnection unit 432 of the storage device 430 and a receiver RX included in the interconnection unit 422 of the host 420 may also form one lane. In the present embodiment, the number of transmitters TX1 to TX4 and receivers RX1 to RX4 included in the interconnection unit 422 of the host 420 is equal to the number of transmitters TX1 to TX4 and receivers RX1 to RX4 included in the interconnection unit 432 of the storage device 430. According to example embodiments, the number of transmitters TX and receivers RX included in the interconnection unit 422 of the host 420 are equal to the number of transmitters TX and receivers RX included in the interconnection unit 432 of the storage device 430. In addition, a capability of the host 420 may be different from a capability of the storage device 430.

The host 420 and the storage device 430 may perform processing of recognizing a lane physically connected thereto and receiving information of a counterpart device, for example, processing such as link startup. The host 420 and the storage device 430 may perform a link startup sequence before exchanging data. The host 420 and the storage device 430 may exchange and recognize information on the number of transmitters TX and receivers RX, information on lanes physically connected thereto, information on capability of a counterpart device, and so one by performing the link start-up sequence. After execution of the link startup sequence is completed, the host 420 and the storage device 430 may be set to a linkup state in which data may be stably exchanged with each other.

In some embodiments, the storage device 430 may include a DRAM-less device. A DRAM-less device may refer to a device that does not include a DRAM cache. In this case, the storage controller 434 may not include a DRAM controller. For example, the storage device 430 may use a partial area of the nonvolatile memory 436 as a buffer memory.

The storage system 410 may include an electronic device such as for example a personal computer (PC), a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), a portable navigation device (PND), an MP3 player, a handheld game console, or an e-book, among others. In addition, the storage system 410 may also include various types of electronic devices such as a wrist watch, or a wearable device such as a head-mounted display (HMD).

FIG. 12 is a diagram illustrating the interface 440 between the host 420 and the storage device 430 of FIG. 11. Concepts of a lane, a line, and a link in the interface 440 of FIG. 12 will be described. Hereinafter, for the sake of convenient description, the transmitter TX1 of the interconnection unit 432 of the storage device 430 and the receiver RX1 of the interconnection unit 422 of the host 420 among a plurality of transmitters and a plurality of receivers included in interconnection units 22 and 32 of FIG. 11 are representatively described.

Referring to FIG. 12, the interface 440 may support a plurality of lanes. Each lane is a unidirectional transmission channel that carries a single signal and information. The lane may include the transmitter TX1, the receiver RX1, and a line for point-to-point interconnection between the transmitter TX1 and the receiver RX1. The transmitter TX1 or the receiver RX1 may have a differential output or an input line interface corresponding to two signaling pins. The pins include a pin DP representing a positive node of the differential signal and a pin DN representing a negative node of the differential signal. Each of the pins DP and DN may be marked with an optional prefix TX or RX to indicate that the pin is used for the transmitter TX1 or the receiver RX1. For example, the lane including the transmitter TX1 and the receiver RX1 includes pins TXDP and TXDN at the transmitter TX1, and the pins RXDP and RXDN at the receiver RX1. The line consists of two differentially routed wires connecting the pins of the transmitter TX1 to the pins of the receiver RX1. The wires are transmission lines.

The interface 440 includes at least one lane in each direction. The number of lanes need not be symmetric in each direction. The link may include one or more lanes in each direction and lane management units 421 and 431 that provide a bidirectional data transmission function. The lane management units 421 and 431 and the controllers 424 and 434 are illustrated as separated from each other in FIG. 12 but are not limited thereto, and the lane management units 421 and 431 may be included in the controllers 424 and 434.

Figure 13:
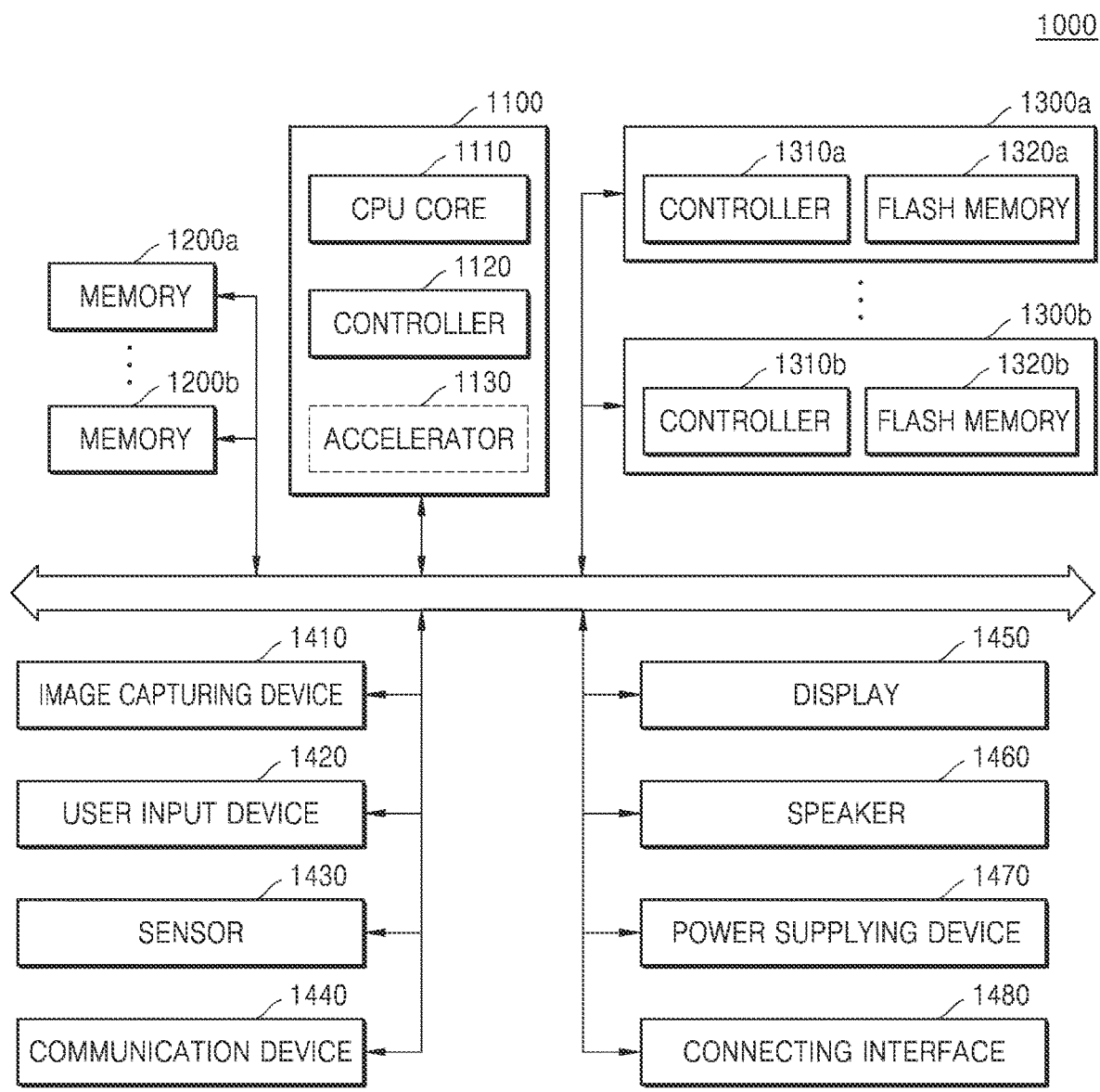
FIG. 13 illustrates a diagram of a system to which a storage device according to embodiments of the inventive concepts may be applied.

FIG. 13 illustrates a diagram of a system to which a storage device is applied, according to embodiments of the inventive concepts. A system 1000 of FIG. 13 may consist of a mobile system such as a mobile phone, a smart phone, a tablet personal computer (PC), a wearable device, a healthcare device, or an Internet of things (IOT) device. However, the system 1000 of FIG. 13 is not limited to the mobile system as described, and may also consist of an automotive device such as a personal computer, a laptop computer, a server, a media player, or a navigation system. Hereinafter, subscripts (for example, a of 1200a and a of 1300a) attached to reference numerals are used to distinguish multiple circuits having the same function from each other.

Referring to FIG. 13, the system 1000 may include a main processor 1100, memories 1200a and 1200b, and storage devices 1300a and 1300b, and may further include one or more of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, and more specifically, may control operations of other components included in the system 1000. The main processor 1100 may include for example a general-purpose processor, a dedicated processor, or an application processor.

The main processor 1100 may include one or more CPU cores 1110 and may further include a controller 1120 for controlling the memories 1200a and 1200b and/or the storage devices 1300a and 1300b. In one embodiment, the main processor 1100 may further include an accelerator block 1130, which is a dedicated circuit for high-speed data operation such as an artificial intelligence (AI) data operation. The accelerator block 1130 may include a graphics processing unit (GPU), a neural processing unit (NPU), and/or a data processing unit (DPU) and may consist of an independent chip physically separated from other components of the main processor 1100.

The memories 1200a and 1200b may be used as main memory devices of the system 1000 and may include volatile memories such as SRAM and/or DRAM, but in addition or in the alternative may include nonvolatile memories such as flash memories, PRAMs, and/or RRAMs. The memories 1200a and 1200b may be embedded in the same package as the main processor 1100.

The storage devices 1300a and 1300b may function as nonvolatile storage devices that store data regardless of whether or not power is supplied and may have a relatively larger storage capacity than the memories 1200a and 1200b. The storage devices 1300a and 1300b may include storage controllers 1310a and 1310b and nonvolatile memory (NVM) storages 1320a and 1320b that store data under the control of the storage controllers 1310a and 1310b. The nonvolatile storages 1320a and 1320b may include V-NAND flash memories having a two-dimensional (2D) structure or a three-dimensional (3D) structure, but may also include other types of nonvolatile memories such as PRAM and/or RRAM.

The storage devices 1300a and 1300b may be physically separated from the main processor 1100 to be included in the system 1000, or may be embedded in the same package as the main processor 1100. In addition, the storage devices 1300a and 1300b may have the same shape as a memory card to be detachably coupled to other components of the system 1000 through an interface such as a connecting interface 1480 to be described below. The storage devices 1300a and 1300b may be devices to which a standard protocol such as a universal flash storage (UFS) is applied, but are not limited thereto.

The image capturing device 1410 may capture a still image or a moving image and may for example include a camera, a camcorder, and/or a webcam.

The user input device 1420 may receive various types of data inputted from a user of the system 1000 and may for example include a touch pad, a keypad, a keyboard, a mouse, a microphone, and/or so on.

The sensor 1430 may detect various types of physical quantities that may be acquired from the outside of the system 1000 and convert the detected physical quantities into electrical signals. The sensor 1430 may for example include a temperature sensor, a pressure sensor, an illuminance sensor, a position sensor, an acceleration sensor, a biosensor, a gyroscope, and/or so on.

The communication device 1440 may transmit and receive signals to and from other devices outside the system 1000 according to various communication protocols. The communication device 1440 may include an antenna, a transceiver, and/or a modem.

The display 1450 and the speaker 1460 may function as output devices that output visual information and audio information, respectively, to a user of the system 1000.

The power supplying device 1470 may appropriately convert power supplied from a battery (not illustrated) embedded in the system 1000 and/or an external power source to supply the converted power to each component of the system 1000.

The connecting interface 1480 may connect the system 1000 to an external device that is connected to the system 1000 and may exchange data with the system 1000. The connecting interface 1480 may be implemented by various interface technologies such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), institute of electrical and electronics engineers (IEEE) 1394, a universal serial bus (USB), a Security Digital™ (SD) card, a Multi-Media Card™ (MMC), an embedded multi-media card (eMMC®), a universal flash storage (UFS), an embedded universal flash storage (eUFS), and a Compact Flash® (CF) card interface.

Figure 14:
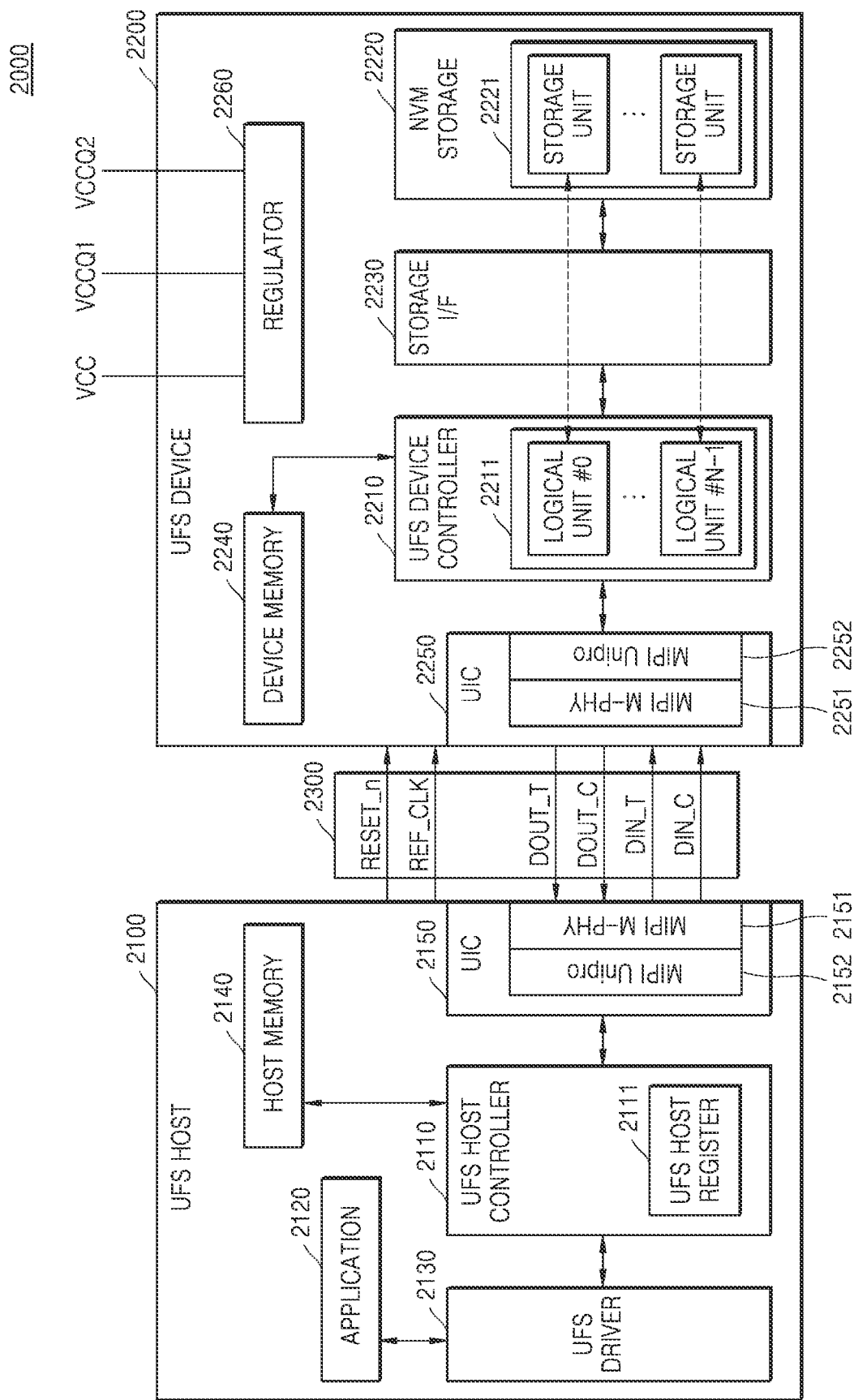
FIG. 14 illustrates a diagram of a universal flash storage (UFS) system according to embodiments of the inventive concepts.

FIG. 14 illustrates a diagram of a UFS system 2000 according to an embodiment of the inventive concepts. The UFS system 2000 is a system that complies with a UFS standard announced by the Joint Electron Devices Engineering Council (JEDEC) and may include a UFS host 2100, a UFS device 2200, and a UFS interface 2300. The previous description of the system 1000 of FIG. 13 may also be applied to the UFS system 2000 of FIG. 14 to the extent in which the description does not conflict with following description of FIG. 14.

Referring to FIG. 14, the UFS host 2100 and the UFS device 2200 may be connected to each other through the UFS interface 2300. When the main processor 1100 of FIG. 13 is an application processor, the UFS host 2100 may be implemented as a part of a corresponding application processor. The UFS host controller 2110 and the host memory 2140 may correspond to the controller 1120 and the memories 1200a and 1200b, respectively, of the main processor 1100 of FIG. 13. The UFS device 2200 may correspond to the storage devices 1300a and 1300b of FIG. 13, and the UFS device controller 2210 and the nonvolatile storage 2220 may correspond to the storage controllers 1310a and 1310b and the nonvolatile storages 1320a and 1320b of FIG. 13, respectively.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the nonvolatile storage 2220, a storage interface (I/F) 2230, a device memory 2240, a UIC layer 2250, and a regulator 2260. The nonvolatile storage 2220 may include a plurality of storage units 2221. Each of the storage units 2221 may include a V-NAND flash memory having a 2D structure or a 3D structure, but may also include other types of nonvolatile memories such as PRAM and/or RRAM. The UFS device controller 2210 and the nonvolatile storage 2220 may be connected to each other through the storage interface 2230. The storage interface 2230 may be implemented to comply with a standard protocol such as toggle or Open NAND Flash Interface Working Group (ONFI).

The application 2120 may indicate a program that may communicate with the UFS device 2200 to use a function of the UFS device 2200. The application 2120 may transmit an input-output request (IOR) to the UFS driver 2130 for input-output to/from the UFS device 2200. The IOR may indicate a read request of data, a write request, and/or a discard request, but is not limited thereto.

The UFS driver 2130 may manage the UFS host controller 2110 through a UFS-host controller interface (HCI) (not shown). The UFS driver 2130 may convert an input-output request generated by the application 2120 into a UFS command defined by a UFS standard, and transmit the converted UFS command to the UFS host controller 2110. One input-output request may be converted into a plurality of UFS commands. The UFS command may be a command basically defined by an SCSI standard but may also be a command exclusively for the UFS standard.

The UFS host controller 2110 may transmit the UFS command converted by the UFS driver 2130 to the UIC layer 2250 of the UFS device 2200 through the UIC layer 2150 and the UFS interface 2300. In this process, the UFS host register 2111 of the UFS host controller 2110 may serve as a command queue (CQ).

The UIC layer 2150 of the UFS host 2100 may include MIPI® M-PHY 2151 and MIPI UniPro® 2152, and the UIC layer 2250 of the UFS device 2200 may also include MIPI M-PHY 2251 and MIPI UniPro 2252.

The UFS interface 2300 may include a line that transmits a reference clock REF_CLK, a line that transmits a hardware reset signal RESET_n for the UFS device 2200, a pair of lines that transmit a pair of differential input signals DIN_T and DIN_C, and a pair of lines that transmit a pair of differential output signals DOUT_T and DOUT_C.

A frequency value of the reference clock REF_CLK provided from the UFS host 2100 to the UFS device 2200 may be one of four values of 19.2 MHz, 26 MHz, 38.4 MHz, and 52 MHz, but is not limited thereto. The UFS host 2100 may change the frequency value of the reference clock REF_CLK during operation, that is, during transmission and reception of data between the UFS host 2100 and the UFS device 2200. The UFS device 2200 may generate clocks of various frequencies from the reference clock REF_CLK provided from the UFS host 2100 by using a phase-locked loop (PLL) (not shown) and so on. In addition, the UFS host 2100 may also set a value of a data rate between the UFS host 2100 and the UFS device 2200 based on a frequency value of the reference clock REF_CLK. That is, the value of the data rate may be determined depending on the frequency value of the reference clock REF_CLK.

The UFS interface 2300 may support multiple lanes, and each lane may be implemented as a differential pair. For example, the UFS interface may include one or more reception lanes and one or more transmission lanes. In FIG. 14, a pair of lines that transmit the pair of differential input signals DIN_T and DIN_C may constitute the reception lanes, and a pair of lines that transmit the pair of differential output signals DOUT_T and DOUT_C may constitute the transmission lanes. Although FIG. 14 illustrates one transmission lane and one reception lane, the number of transmission lanes and the number of reception lanes may be changed.

The reception lane and the transmission lane may transmit data in a serial communication method, and a full duplex communication between the UFS host 2100 and the UFS device 2200 may be made by a structure in which the reception lane and the transmission lane are separated from each other. That is, the UFS device 2200 may transmit data to the UFS host 2100 through the transmission lane even while receiving data from the UFS host 2100 through the reception lane. In addition, control data such as a command from the UFS host 2100 to the UFS device 2200, and user data that the UFS host 2100 intends to store in the nonvolatile storage 2220 of the UFS device 2200 or to read from the nonvolatile storage 2220 may be transmitted through the same lane. Accordingly, there is no need to further provide a separate lane for data transmission between the UFS host 2100 and the UFS device 2200, in addition to the pair of reception lanes and the pair of transmission lanes.

The UFS device controller 2210 of the UFS device 2200 may control all operations of the UFS device 2200. The UFS device controller 2210 may manage the nonvolatile storage 2220 through logical units (LUs) 2211 (e.g., logical unit (circuit) 0, . . . logical unit N−1) that are units of a logical data storage. The number of LUs 2211 may be 8 but is not limited thereto. The UFS device controller 2210 may include a flash translation layer (FTL) (not shown) and may convert a logical data address, such as a logical block address (LBA), transmitted from the UFS host 2100 by using address mapping information of the FTL into a physical data address, for example, a physical block address (PBA). In the UFS system 2000, a logical block for storing the user data may have a size of a predetermined range. For example, the smallest size of the logical block may be set to 4 Kbyte.

When a command from the UFS host 2100 is inputted to the UFS device 2200 through the UIC layer 2250, the UFS device controller 2210 may perform an operation according to the input command and may transmit a completion response to the UFS host 2100 when the operation is completed.

For example, when the UFS host 2100 intends to store user data in the UFS device 2200, the UFS host 2100 may transmit a data storage command to the UFS device 2200. When receiving a response indicating that the user data is ready to be transmitted (ready-to-transfer) from the UFS device 2200, the UFS host 2100 may transmit the user data to the UFS device 2200. The UFS device controller 2210 may temporarily store the transmitted user data in the device memory 2240, and may store the user data temporarily stored in the device memory 2240 at a selected position of the nonvolatile storage 2220 based on address mapping information of the FTL.

For example, when the UFS host 2100 intends to read user data stored in the UFS device 2200, the UFS host 2100 may transmit a data read command to the UFS device 2200. Upon receiving the command, the UFS device controller 2210 may read the user data from the nonvolatile storage 2220 based on the data read command and temporarily store the read user data in the device memory 2240. During the read process, the UFS device controller 2210 may detect and correct an error in the read user data by using an embedded error correction code (ECC) circuit (not shown). In addition, the UFS device controller 2210 may transmit the user data temporarily stored in the device memory 2240 to the UFS host 2100. In addition, the UFS device controller 2210 may further include an advanced encryption standard (AES) circuit (not shown), and the AES circuit may encrypt or decrypt data inputted to the UFS device controller 2210 by using a symmetric-key algorithm.

The UFS host 2100 may sequentially store commands to be transmitted to the UFS device 2200 in the UFS host register 2111 that may function as a command queue, and may transmit the commands to the UFS device 2200 in the order described above. In this case, even when the previously transmitted command is still being processed by the UFS device 2200, that is, even before receiving a notification that processing of the previously transmitted command is completed by the UFS device 2200, the UFS host may transmit the next command waiting in the command queue to the UFS device 2200, and accordingly, the UFS device 2200 may also receive the next command from the UFS host 2100 while processing the previously transmitted command. The largest number (queue depth) of commands that may be stored in the command queue may be, for example, 32. In addition, the command queue may be implemented as a circular queue type indicating start and end of a command stream stored in the queue through a head pointer and a tail pointer.

Each of the plurality of storage units 2221 may include a memory cell array and a control circuit that controls an operation of the memory cell array. The memory cell array may include a 2D memory cell array or a 3D memory cell array. The memory cell array includes a plurality of memory cells, and each of the memory cells may also be a single level cell (SLC) that stores information of 1 bit, but may also be a cell that stores information of two or more bits, such as a multi-level cell (MLC), a triple level cell (TLC), or a quadruple level cell (QLC). The 3D memory cell array may include a vertical NAND string that is vertically oriented so that at least one memory cell is on another memory cell.

VCC, VCCQ1, VCCQ2, or so on may be inputted to the UFS device 2200 as a power supply voltage. VCC is a main power supply voltage for the UFS device 2200 and may have a value of 2.4 to 3.6 V. VCCQ is a power supply voltage for supplying a low range voltage and is mainly for the UFS device controller 2210 and may have a value of 1.14 to 1.26 V. VCCQ2 is a power supply voltage for supplying a voltage in a range lower than VCC but higher than VCCQ and is mainly for input-output interfaces such as the MIPI M-PHY 2251 and may have a value of 1.7 to 1.95V. The power supply voltages may be supplied to each component of the UFS device 2200 through the regulator 2260. The regulator 2260 may be implemented as a set of unit regulators connected to other power supply voltages, respectively, among the power supply voltages described above.

Figure 15:
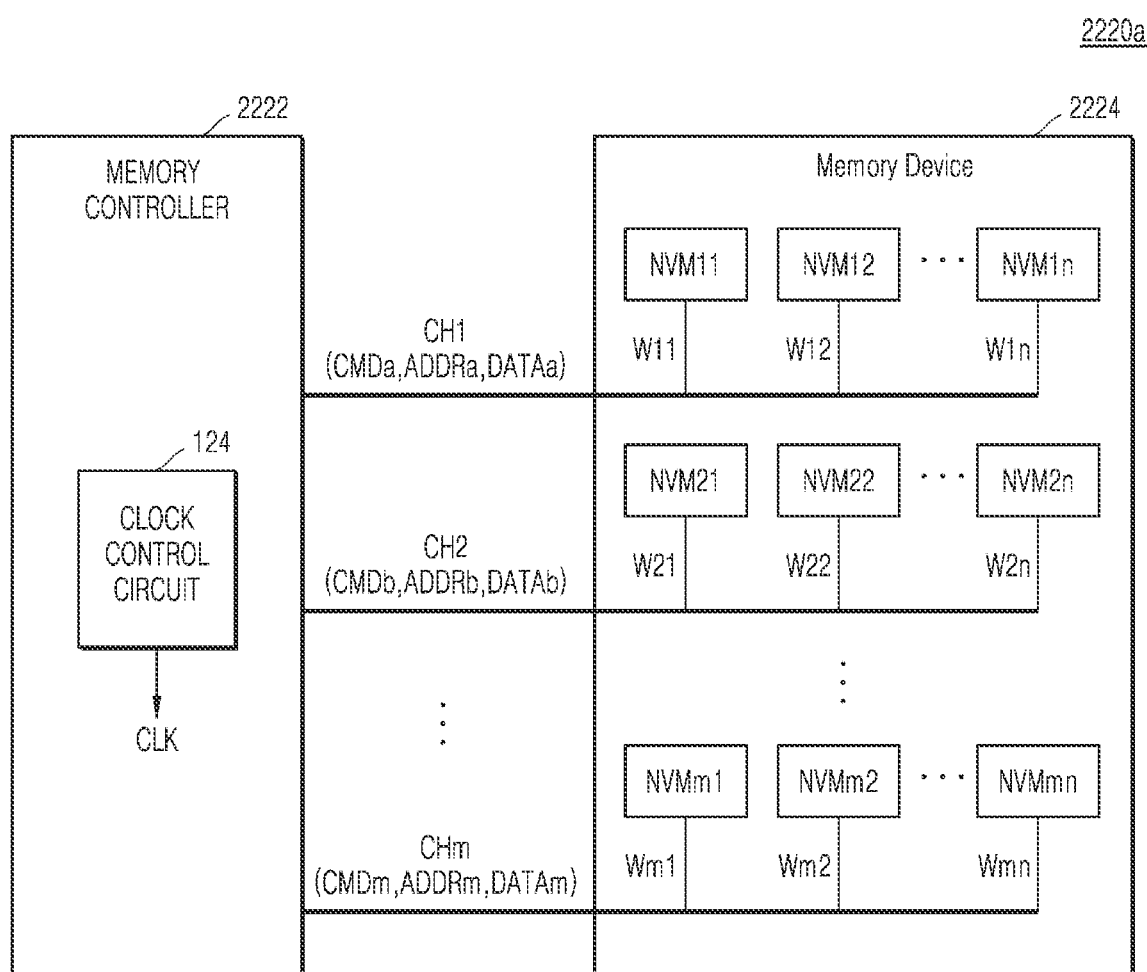
FIG. 15 illustrates a block diagram of a nonvolatile storage according to embodiments of the inventive concepts.

FIG. 15 illustrates a block diagram of a nonvolatile storage according to embodiments of the inventive concepts.

Referring to FIG. 15, a nonvolatile storage 2220a may include a memory device 2224 and a memory controller 2222. The nonvolatile storage 2220a may support a plurality of channels CH1 to CHm, and the memory device 2224 and the memory controller 2222 may be connected to each other through the plurality of channels CH1 to CHm. For example, the nonvolatile storage 2220a may include a storage device such as a solid state drive (SSD). The nonvolatile storage 2220a may correspond to the storage device 100 described with reference to FIGS. 1 to 10.

The memory device 2224 may include a plurality of nonvolatile memory devices NVM11 to NVMmn Each of the nonvolatile memory devices NVM11 to NVMmn may be connected to one of the plurality of channels CH1 to CHm through a corresponding way. For example, the nonvolatile memory devices NVM11 to NVM1$n$ may be connected to the first channel CH1 through ways W11 to W1$n$, and the nonvolatile memory devices NVM21 to NVM2$n$ may be connected to the second channel CH2 through ways W21 to W2$n$. Likewise, the nonvolatile memory devices NVMm1 to NVMmn may be connected to the mth channel CHm through ways Wm1 to Wmn. In an example embodiment, each of the nonvolatile memory devices NVM11 to NVMmn may be composed of a certain memory unit capable of operating according to an individual command from the memory controller 2222. For example, each of the nonvolatile memory devices NVM11 to NVMmn may be composed of a chip or die, but the inventive concepts are not limited thereto.

The memory controller 2222 may transmit and receive signals to and from the memory device 2224 through the plurality of channels CH1 to CHm. For example, the memory controller 2222 may transmit commands CMDa to CMDm, addresses ADDRa to ADDRm, and data DATAa to DATAm to the memory device 2224 through the channels CH1 to CHm, or may receive the data DATAa to DATAm from the memory device 2224.

The memory controller 2222 may select one of the nonvolatile memory devices connected to the corresponding channel through each channel and may transmit and receive signals to and from the selected nonvolatile memory device. For example, the memory controller 2222 may select the nonvolatile memory device NVM11 from among the nonvolatile memory devices NVM11 to NVM1$n$ connected to the first channel CH1. The memory controller 2222 may transmit the command CMDa, the address ADDRa, and the data DATAa to the selected nonvolatile memory device NVM11 through the first channel CH1, or may receive the data DATAa from the selected nonvolatile memory device NVM11.

The memory controller 2222 may transmit and receive signals to and from the memory device 2224 in parallel through different channels. For example, the memory controller 2224 may transmit the command CMDb to the memory device 2224 through the second channel CH2 while transmitting the command CMDa to the memory device 2224 through the first channel CH1. For example, the memory controller 2222 may receive the data DATAb from the memory device 2224 through the second channel CH2 while receiving the data DATAa from the memory device 2224 through the first channel CH1.

The memory controller 2222 may control all operations of the memory device 2224. The memory controller 2222 may control the respective nonvolatile memory devices NVM11 to NVMmn connected to the channels CH1 to CHm by transmitting signals to the channels CH1 to CHm. For example, the memory controller 2222 may control a selected one of the nonvolatile memory devices NVM11 to NVM1$n$ by transmitting the command CMDa and the address ADDRa to the first channel CH1.

Each of the nonvolatile memory devices NVM11 to NVMmn may operate under the control of the memory controller 2222. For example, the nonvolatile memory device NVM11 may program the data DATAa according to the command CMDa, the address ADDRa, and the data DATAa provided to the first channel CH1. For example, the nonvolatile memory device NVM21 may read the data DATAb according to the command CMDb and the address ADDRb provided to the second channel CH2, and may transmit the read data DATAb to the memory controller 2222.

Although FIG. 15 illustrates that the memory device 2224 communicates with the memory controller 2222 through m channels and the memory device 2224 includes n nonvolatile memory devices corresponding to respective channels, the number of channels and the number of nonvolatile memory devices connected to one channel may be variously changed.

The memory controller 2222 may include the clock control circuit 124 described in FIG. 1. The clock control circuit 124 may generate a clock signal CLK to adjust a timing of the memory controller 2222 and may control toggling signals (for example, the read enable signal nRE and the data strobe signal DQS) provided to the memory device 2224 based on the clock signal CLK.

Figure 16A:
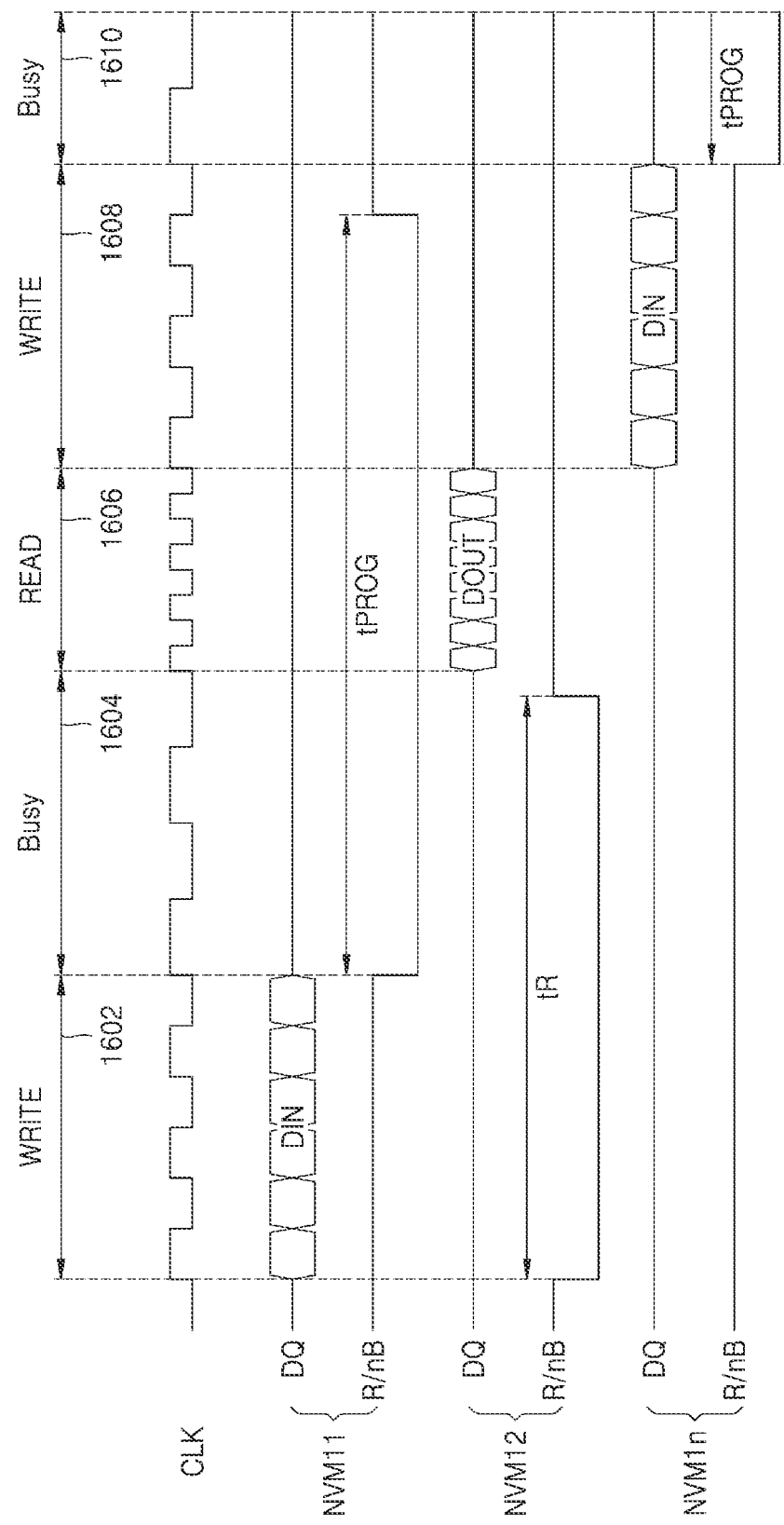
FIGS. 16A and 16B illustrate timing diagrams of a method of operating a storage device according to embodiments of the inventive concepts.
Figure 16B:
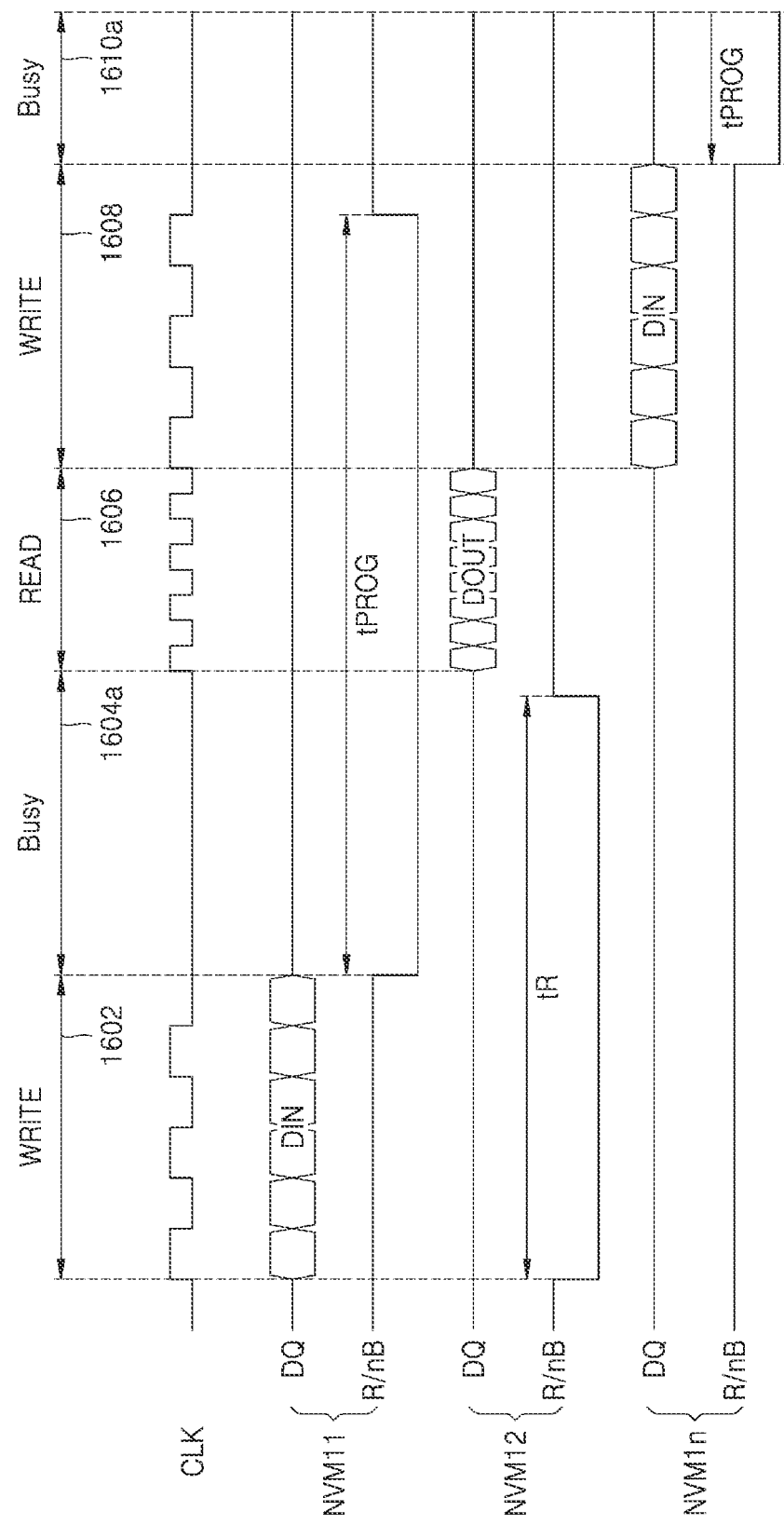

FIGS. 16A and 16B illustrate timing diagrams descriptive of a method of operating a storage device according to embodiments of the inventive concepts. FIGS. 16A and 16B illustrate the clock signal CLK, the data signal DQ, and the ready-busy output signal R/nB associated with operation periods 1602, 1604, 1606, 1608, and 1610 of the nonvolatile memory devices NVM11 to NVM1$n$ connected to the first channel CH1 of FIG. 15.

Referring to FIGS. 15 and 16A, in a write operation period 1602, the write data DIN for a write operation to the nonvolatile memory device NVM11 may be received through a data signal DQ line. In this case, the memory controller 2222 may transmit the write data DIN to the nonvolatile memory device NVM11 in synchronization with the data strobe signal DQS generated based on the clock signal CLK switched to a high frequency.

During a busy period 1604, the nonvolatile memory device NVM11 may transmit the ready-busy output signal R/nB indicating a busy status (for example, a low level) to the memory controller 2222 during a period tPROG in which a program operation of writing the write data DIN to memory cells is performed. During the busy period 1604 in which the ready-busy output signal R/nB in a busy status is output, the memory controller 2222 may be switched to a clock signal CLK having a low frequency.

During a read operation period 1606, the nonvolatile memory device NVM12 may transmit the output data DOUT to the memory controller 2222 through the data signal DQ line. In this case, the memory controller 2222 may transmit a read enable signal that is toggled to the nonvolatile memory device NVM12 based on the clock signal CLK switched to the highest frequency. The nonvolatile memory device NVM12 may generate a data strobe signal according to the read enable signal that is toggled at the highest frequency and may transmit the output data DOUT to the memory controller 2222 in synchronization with the data strobe signal. The nonvolatile memory device NVM12 may output the busy ready-busy output signal R/nB during a period tR in which a read operation including a page read operation is performed before transmitting the output data DOUT.

During a write operation period 1608, the write data DIN for a write operation to the nonvolatile memory device NVM1$n$ may be received through the data signal DQ line. In this case, the memory controller 2222 may transmit the write data DIN to the nonvolatile memory device NVM1$n$ in synchronization with the data strobe signal DQS generated based on the clock signal CLK switched to a high frequency.

The nonvolatile memory device NVM1$n$ may transmit the ready-busy output signal R/nB indicating a busy status to the memory controller 2222 during the period tPROG in which a program operation of writing the write data DIN to memory cells is performed. During a busy period 1610 in which the ready-busy output signal R/nB in a busy status is outputted, the memory controller 2222 may be switched to a clock signal CLK having a low frequency.

Referring to FIG. 16B, as compared with FIG. 16A, the memory controller 2222 may control the clock signal CLK to not toggle during busy periods 1604$a$ and 1610$a$. A clock signal CLK that does not toggle may be characterized as having low frequency (i.e., no frequency) as compared to the clock signal CLK having high frequency.

According to the storage device of the inventive concepts, a memory controller may determine a low-power operation status and a high-power operation status for one operation of a memory device, control the memory device by switching a clock signal to a low frequency clock signal during a low-power operation mode, and control the memory device by switching the clock signal to a high frequency clock signal during a high-power operation mode. Accordingly, power consumption of a storage device may be reduced.

While the inventive concepts have been particularly shown and described with reference to embodiments thereof, it should be understood that various changes in form and detail may be made therein without departing from the spirit and scope of the following claims.

What is claimed is:

1. An apparatus comprising:
   a plurality of signal pins respectively connected to an external device through a plurality of signal lines; and
   a clock control circuit configured to instruct the external device through some of the plurality of signal pins to perform one operation having a first operation mode and a second operation mode, and configured to generate a clock signal relating to the first operation mode and the second operation mode for the one operation of the external device,
   wherein the clock control circuit is configured to switch a frequency of the clock signal to a first frequency during the first operation mode of the one operation, and switch the frequency of the clock signal to a second frequency different from the first frequency during the second operation mode according to de-assertion of a status signal of the external device provided to the apparatus from the external device, and wherein the external device comprises a nonvolatile memory device, and wherein the one operation is a read operation of the nonvolatile memory device, and the clock control circuit is configured to generate the clock signal having a low frequency while the nonvolatile memory device reads data stored in a memory cell of the nonvolatile memory device, and generate the clock signal having a high frequency while the nonvolatile memory device transmits the data read from the nonvolatile memory device to the apparatus.

2. The apparatus of claim 1, wherein the first operation mode is a low-power operation mode associated with the clock signal having the first frequency, and the second operation mode is a high-power operation mode associated with the clock signal having the second frequency.

3. The apparatus of claim 1, wherein the first frequency is a low frequency, and the second frequency is a high frequency.

4. The apparatus of claim 1, wherein the clock signal does not toggle while the nonvolatile memory device reads the data stored in the memory cell.

5. The apparatus of claim 1, wherein the apparatus receives the status signal indicating a busy status during the first operation mode of the one operation performed by the external device through a signal pin from among the plurality of signal pins, and the clock control circuit is configured to generate the clock signal having the first frequency which is set to a relatively low frequency based on the status signal indicating the busy status.

6. The apparatus of claim 5, wherein the apparatus receives the status signal de-asserting to a ready status during the second operation mode in the one operation performed by the external device, and the clock control circuit is configured to generate the clock signal having the second frequency which is set to a relatively high frequency based on the status signal in the ready status.

7. An apparatus comprising:

a plurality of signal pins respectively connected to an external device through a plurality of signal lines; and a clock control circuit configured to instruct the external device through some of the plurality of signal pins to perform one operation having a first operation mode and a second operation mode, and configured to generate a clock signal relating to the first operation mode and the second operation mode for the one operation of the external device, wherein the clock control circuit is configured to switch a frequency of the clock signal to a first frequency during the first operation mode of the one operation, and switch the frequency of the clock signal to a second frequency different from the first frequency during the second operation mode according to de-assertion of a status signal of the external device provided to the apparatus from the external device, and wherein the external device comprises a nonvolatile memory device, wherein the one operation is a write operation of the nonvolatile memory device, and the clock control circuit is configured to generate the clock signal having a high frequency while transmitting write data to the nonvolatile memory device, and generate the clock signal having a low frequency while the nonvolatile memory device programs the write data to memory cells of the nonvolatile memory device.

8. The apparatus of claim 7, wherein the clock signal does not toggle while the write data is programmed to the memory cells of the nonvolatile memory device.

9. An apparatus comprising:

a plurality of signal pins respectively connected to an external device through a plurality of signal lines; and a clock control circuit configured to instruct the external device through some of the plurality of signal pins to perform one operation having a first operation mode and a second operation mode, and configured to generate a clock signal relating to the first operation mode and the second operation mode for the one operation of the external device, wherein the clock control circuit is configured to switch a frequency of the clock signal to a first frequency during the first operation mode of the one operation, and switch the frequency of the clock signal to a second frequency different from the first frequency during the second operation mode according to de-assertion of a status signal of the external device provided to the apparatus from the external device, and wherein the external device comprises a nonvolatile memory device, wherein the clock control circuit is configured to set the second frequency of the clock signal to be relatively higher when the nonvolatile memory device performs a read operation of reading data stored in memory cells of the nonvolatile memory device than when the nonvolatile memory device performs a write operation of programming data to the memory cells.

* * * * *